US012666826B2

(12) United States Patent
Zeng

(10) Patent No.: US 12,666,826 B2
(45) Date of Patent: Jun. 23, 2026

(54) DISPLAY PANEL AND DISPLAY DEVICE

(71) Applicant: Shanghai Tianma Microelectronics Co., Ltd., Shanghai (CN)

(72) Inventor: Yang Zeng, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 372 days.

(21) Appl. No.: 18/204,575

(22) Filed: Jun. 1, 2023

(65) Prior Publication Data

US 2023/0329052 A1 Oct. 12, 2023

(30) Foreign Application Priority Data

Nov. 30, 2022 (CN) .......................... 202211527550.X

(51) Int. Cl.
*H10K 59/131* (2023.01)
*H10K 59/13* (2023.01)
*H10K 59/35* (2023.01)

(52) U.S. Cl.
CPC ........... *H10K 59/131* (2023.02); *H10K 59/13* (2023.02); *H10K 59/352* (2023.02); *H10K 59/353* (2023.02)

(58) Field of Classification Search
CPC .. G06F 3/1446; H10K 59/352; H10K 59/353; H10K 59/131; G09G 2310/0232; G09G 3/3233; G09G 2300/0452; G09G 2300/0842; G09G 2310/0281; G09G 2320/0233; G09G 2320/0242; G09G 2340/0407; G09G 3/3266; G09G 2300/023; G09G 2300/026; G09G 2300/0426; G09G 2300/0439; G09G 2310/08; G09G 2360/04; G09G 3/2092
See application file for complete search history.

(56) References Cited

U.S. PATENT DOCUMENTS

| | | | | |
|---|---|---|---|---|
| 11,322,566 B2* | 5/2022 | Zhang | .................. | H10K 59/121 |
| 11,521,410 B2* | 12/2022 | Cho | ........................ | G09G 5/003 |
| 2017/0069702 A1* | 3/2017 | Jeong | ...................... | G04C 17/00 |
| 2020/0124910 A1* | 4/2020 | Hwang | ............. | G02F 1/136209 |
| 2022/0102421 A1* | 3/2022 | Yang | .................... | H10H 20/857 |

(Continued)

FOREIGN PATENT DOCUMENTS

| | | | | |
|---|---|---|---|---|
| CN | 107589600 A | | 1/2018 | |
| CN | 110875361 A | * | 3/2020 | ........... H10K 59/353 |

(Continued)

*Primary Examiner* — Edward Chin
(74) *Attorney, Agent, or Firm* — KDW Firm PLLC

(57) ABSTRACT

Provided are a display panel and a display device, which relate to the field of display technologies. The display panel includes a display region, where the display region includes a first display region and a second display region, and a transmittance of the first display region is higher than a transmittance of the second display region; and the first display region includes connection-lines including first connection-lines, where multiple first connection-lines extend in different directions from a region closer to the center of the first display region toward a region farther away from the center of the first display region. The display panel and the display device reduce the misalignment extent among connection-lines at an inclined viewing angle.

20 Claims, 25 Drawing Sheets

(56)            References Cited

U.S. PATENT DOCUMENTS

2022/0336543 A1 * 10/2022 Liu ..................... H10K 59/8723
2022/0392964 A1 * 12/2022 Wu ...................... H10K 59/131

FOREIGN PATENT DOCUMENTS

| CN | 112151592 | A | | 12/2020 | | |
|----|-----------|---|---|---------|---|----------|
| CN | 107589600 | B | * | 3/2021 | ........... | G09G 3/2003 |
| CN | 114156331 | A | * | 3/2022 | ........... | H10K 59/122 |
| KR | 102430429 | B1 | * | 8/2022 | ............ | G04G 9/022 |
| KR | 102625859 | B1 | * | 1/2024 | ........... | G04G 9/0035 |
| WO | WO-2022147679 | A1 | * | 7/2022 | ........... | H10K 59/131 |

* cited by examiner

200/2001

200/2002

2003

2004

S2

DISPLAY PANEL AND DISPLAY DEVICE

CROSS-REFERENCE TO RELATED APPLICATION(S)

This application claims priority to Chinese Patent Application No. 202211527550.X filed Nov. 30, 2022, the disclosure of which is incorporated herein by reference in its entirety.

TECHNICAL FIELD

The present disclosure relates to the field of display technologies and, in particular, to a display panel and a display device.

BACKGROUND

With the development of display technology, a "bezel-less" display screen, a "full screen" and other display screens have become a research hotspot in the display field. A larger screen-to-body ratio provides users with better visual experience and can display more information. Therefore, the pursuit of the larger screen-to-body ratio has become the mainstream development trend of display products.

In the related art, to pursue a large screen-to-body ratio, the bezel of a display product is continuously narrowed and a full screen with a hole structure becomes the latest trend of design, where devices such as a camera and an earpiece can be placed at the position of the hole. The screen-to-body ratio can be maximized by opening a display region of a display screen to place the camera.

How to improve the display effect of a display panel which is a full screen with a hole structure becomes an urgent technical problem to be solved.

SUMMARY

The present disclosure provides a display panel and a display device to reduce the misalignment extent among connection-lines at an inclined viewing angle.

Embodiments of the present disclosure provide a display panel including a display region, where the display region includes a first display region and a second display region, and a transmittance of the first display region is higher than a transmittance of the second display region. The first display region includes connection-lines including first connection-lines, where multiple first connection-lines extend in different directions from a region closer to the center of the first display region toward a region farther away from the center of the first display region.

Embodiments of the present disclosure provide a display device including a display panel and a photosensor. The display panel including a display region, where the display region includes a first display region and a second display region, and a transmittance of the first display region is higher than a transmittance of the second display region. The first display region includes connection-lines including first connection-lines, where multiple first connection-lines extend in different directions from a region closer to the center of the first display region toward a region farther away from the center of the first display region. The photosensor is disposed in a first display region and on a non-light-emitting display side of the display panel.

DETAILED DESCRIPTION

Figure 1:
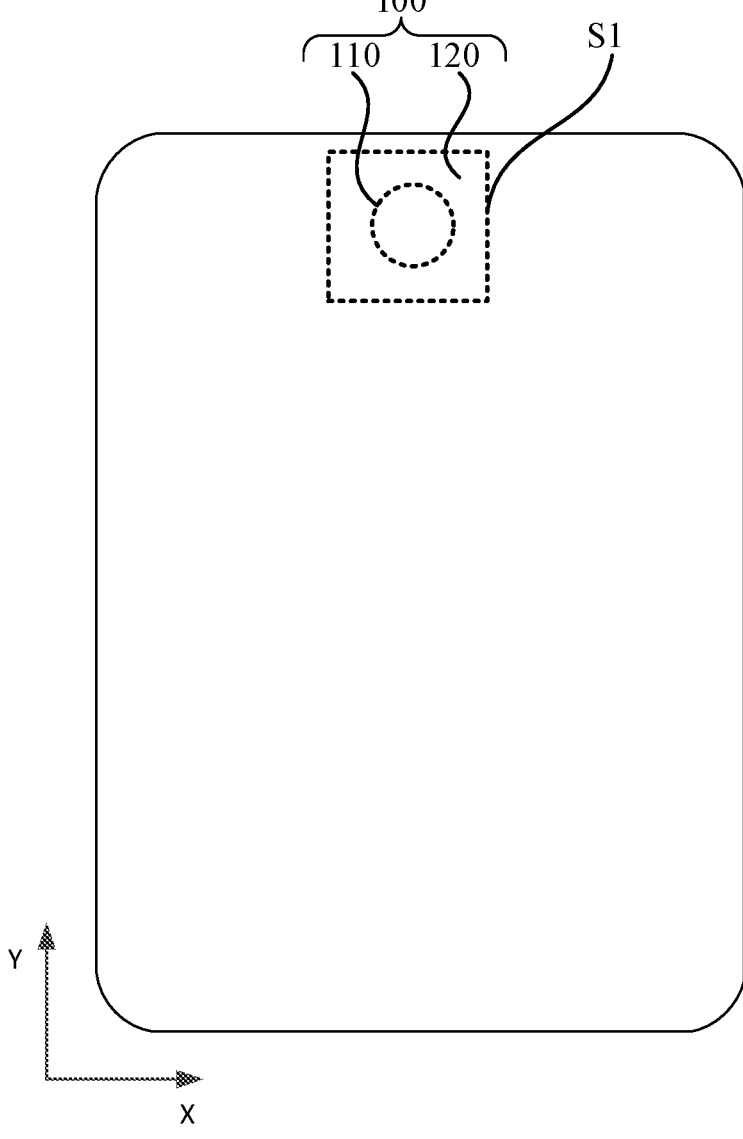
FIG. 1 is a top view of a display panel according to an embodiment of the present disclosure.

Hereinafter the present disclosure is further described in detail in conjunction with the drawings and embodiments. It is to be understood that the embodiments described herein are intended to illustrate and not to limit the present disclosure. Additionally, it is to be noted that for ease of description, only part, not all, of structures related to the present disclosure are illustrated in the drawings.

Figure 2:
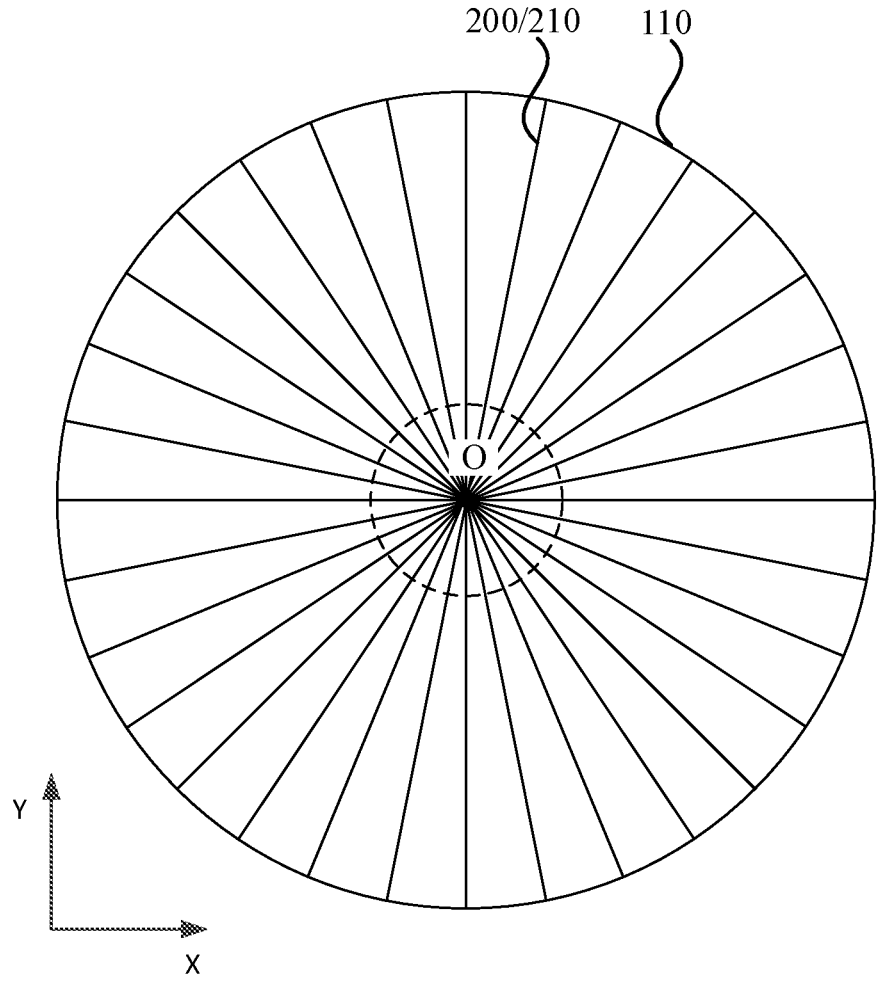
FIG. 2 is a top view of a first display region of the display panel in FIG. 1.

FIG. 1 is a top view of a display panel according to an embodiment of the present disclosure. FIG. 2 is a top view of a first display region of the display panel in FIG. 1.

Referring to FIGS. 1 and 2, the display panel includes a display region 100 (also referred as a region S1), where the display region 100 may be used for image display. The display region 100 includes a first display region 110 and a second display region 120, and a transmittance of the first display region 110 is higher than a transmittance of the second display region 120. On the one hand, the first display region 110 may be used for image display. On the other hand, the first display region 110 has a higher transmittance, and light can pass through the first display region 110 and reach a non-light-emitting display side of the display panel, that is, reach the back side of the display panel, to implement particular optical functions such as image capture.

The first display region 110 includes a connection-line 200 including a first connection-line 210, where multiple first connection-lines 210 extend in different directions from a region closer to the center O of the first display region 110 (the region being shown by a dashed circle in FIG. 2) toward a region farther away from the center O of the first display region 110. In some optional embodiments, the region closer to the center of the first display region refers to a region in the vicinity of the center O of the first display region.

It is to be noted that the first connection-line 210 may pass through the center O of the first display region. In some other embodiments, the first connection-line 210 may not pass through the center O of the first display region. An extension line of the first connection-line 210) may also not pass through the center O of the first display region.

During researching, the inventor(s) has found that, the misalignment of the connection-lines 200 in the first display region 110 occurs at an inclined viewing angle, causing problems such as shielding and diffraction. Embodiments of the present disclosure provide the display panel, where the connection-lines 200 includes first connection-lines 210. The first connection-lines 210 is disposed in a manner of radiating from the center of the first display region 110 and extend from a region closer to the center of the first display region toward a region farther away from the center of the first display region in a radial direction of the first display region 110 or in a substantially radial direction of the first display region 110. The radial direction refers to a direction away from the center O of the first display region from the vicinity of the center O of the first display region 110. For example, when the first display region is in the shape of a circle, the radial direction is parallel to the radius or diameter of the circle. Such an arrangement is consistent with the fact that with the center O of the first display region as the center of a viewing angle, the further away from the center O of the first display region, the larger the viewing angle. That is to say, the extension direction of the first connection-lines 210 is consistent with the direction in which the viewing angle increases, to reduce the misalignment extent among the connection-lines 200 at the inclined viewing angle.

Figures 3, 4:
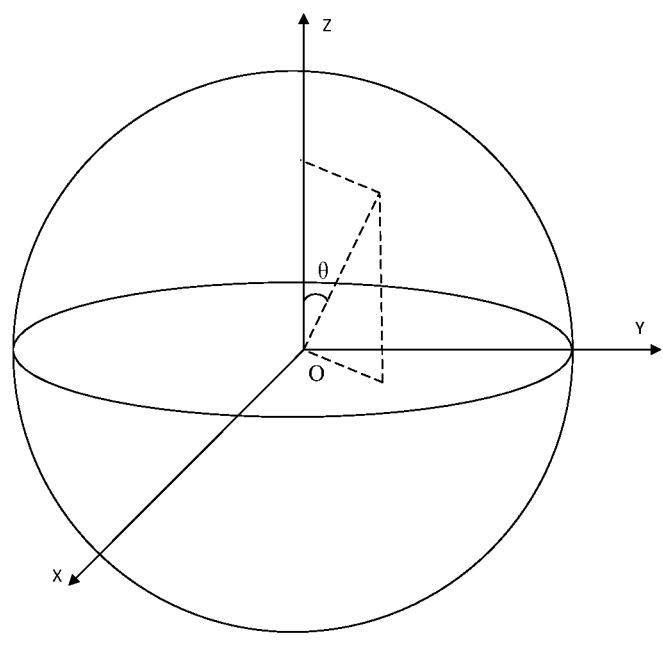
FIG. 3 is a schematic diagram of an inclined viewing angle.
FIG. 4 is a schematic diagram of misalignment of connection-lines at an inclined viewing angle.

It is to be noted that FIG. 3 is a schematic diagram of the inclined viewing angle and FIG. 4 is a schematic diagram of misalignment of connection-lines at the inclined viewing angle. Referring to FIGS. 2 to 4, a plane where the display panel is located is denoted as an XY plane, where the XY plane is determined by a first direction X and a second direction Y. A vertical direction Z is perpendicular to the XY plane. A viewing angle θ is an included angle between a line of sight and the vertical direction Z. Based on the center O of the first display region 110, the viewing angle θ gradually increases in the direction away from the center O of the first display region from the vicinity of the center O of the first display region 110.

Referring to FIGS. 2 to 4, the connection-lines 200 include a first-height connection-line 2001, and a projection of the first-height connection-line 2001 at the inclined viewing angle is a first projected connection-line 2003. In the XY plane, the first projected connection-line 2003 is drifted. That is, the first projected connection-line 2003 at the inclined viewing angle is misaligned with a projection of the connection-line 200 at an orthogonal viewing angle.

Referring to FIGS. 2 to 4, the connection-line 200 includes the first-height connection-line 2001 and a second-height connection-line 2002, which are located at different heights in the vertical direction Z. A projection of the second-height connection-line 2002 at the inclined viewing angle is a second projected connection-line 2004. In the XY plane, the second projected connection-line 2004 is drifted. Further, the first-height connection-line 2001 and the second-height connection-line 2002 are right opposite at the orthogonal viewing angle, while a position relationship between the first projected connection-line 2003 and the second projected connection-line 2004 formed at the inclined viewing angle changes, which are drifted in the XY plane. That is to say: since the first-height connection-line 2001 and the second-height connection-line 2002 have different heights, the projections formed by the first-height connection-line 2001 and the second-height connection-line 2002 at the inclined viewing angle have different amounts of drift. Thus, the position relationship between the first projected connection-line 2003 and the second projected connection-line 2004 changes, which are formed by the first-height connection-line 2001 and the second-height connection-line 2002, respectively. Finally, at the inclined viewing angle, the first-height connection-line 2001 and the second-height connection-line 2002 are no longer directly opposite.

In some embodiments, referring to FIG. 2, the first connection-line 210 includes a straight line segment, where a radial component of the straight line segment is greater than a tangential component of the straight line segment. The radial component of the straight line segment refers to a component of the straight line segment along the radial direction of the first display region 110. The tangential component of the straight line segment refers to a component of the straight line segment along a direction perpendicular to the radial direction. The greater the radial component of the straight line segment, the more an extension direction of the straight line segment approximates to the radial direction. The greater the tangential component of the straight line segment, the more the extension direction of the straight line segment approximates to the direction perpendicular to the radial direction. It can be seen that the radial component of the straight line segment is set to be greater than the tangential component of the straight line segment so that the extension direction of the straight line segment can approximate more to the radial direction, to increase the consistency of the extension direction of the first connection-line 210 with the direction in which the viewing angle increases and reduce the misalignment extent among the connection-lines 200 at the inclined viewing angle.

In some embodiments, referring to FIG. 2, the substantial extension direction of the first connection-line 210 or an overall wiring direction of a wire is a straight line segment and passes through the center O of the first display region 110. The straight line segment included in the first connection-line 210 has only the radial component and has no tangential component. The extension direction of the straight line segment included in the first connection-line 210 is the radial direction and consistent with the direction in which the viewing angle increases. Therefore, the extension direction of the first connection-line 210 is consistent with the direction in which the viewing angle increases, reducing the misalignment extent among the connection-lines 200 at the inclined viewing angle.

To adapt to an arrangement direction of sub-pixels, a wire in the display panel is not an ideal straight line or an ideal straight line segment, but some line segments of the wire are bent. However, a particular wire generally extends along a fixed direction. Thus, that the first connection-line 210 is a straight line segment means that the substantial extension direction of the first connection-line 210 or the overall wiring direction of the wire is a straight line segment.

In other embodiments, the extension line of the first connection-line 210 passes through the center O of the first display region 110. The straight line segment included in the first connection-line 210 has only the radial component and has no tangential component. The extension direction of the first connection-line 210 is consistent with the direction in which the viewing angle increases, reducing the misalignment extent among the connection-lines 200 at the inclined viewing angle.

Figure 5:
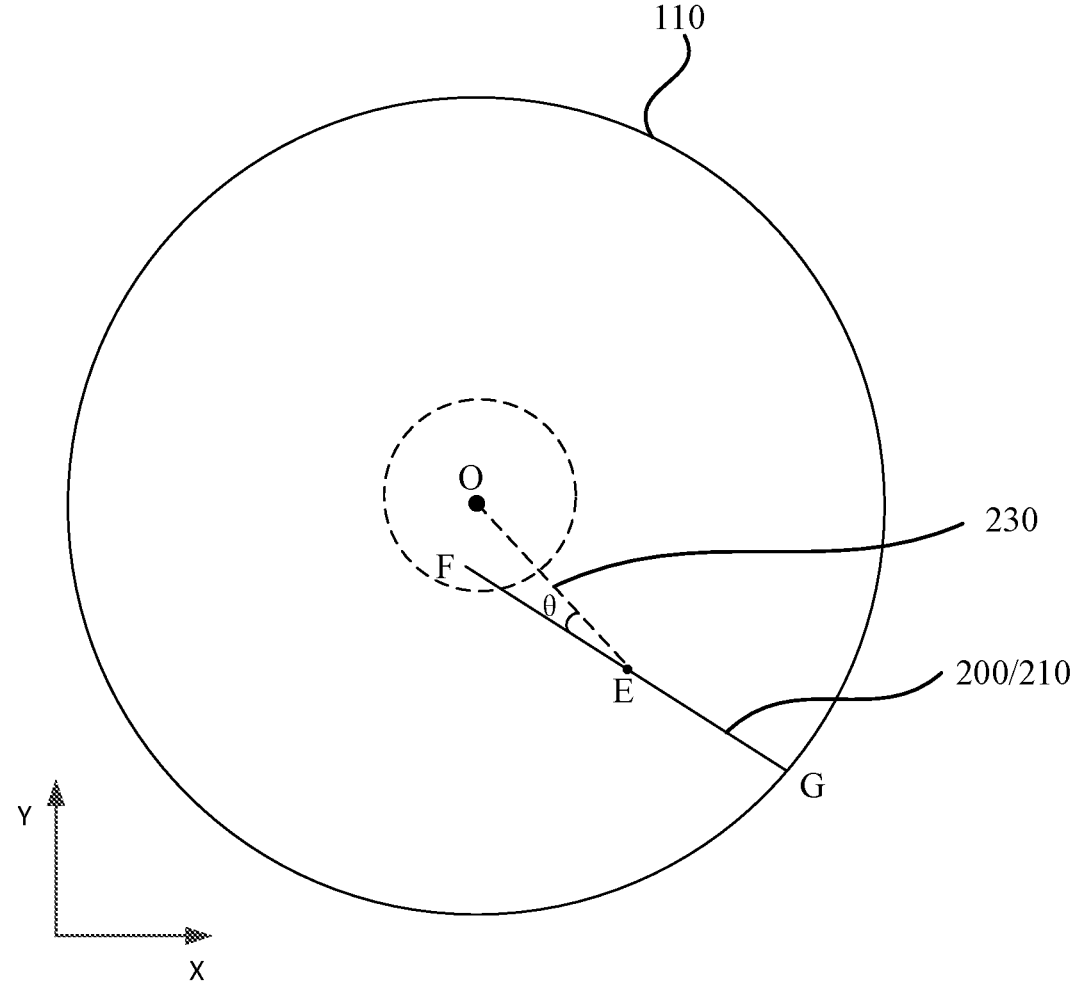
FIG. 5 is another top view of a first display region of the display panel in FIG. 1.

FIG. 5 is another top view of the first display region in FIG. 1. Referring to FIGS. 1 and 5, the first connection-line 210 includes a straight line segment, where a line between the center of the straight line segment and the center O of the first display region 110 is denoted as an auxiliary line 230 and the included angle between the auxiliary line 230 and the first connection-line 210 is smaller than or equal to 45°. The center of the straight line segment is a center of the straight line segment along a length extension direction of the straight line segment. The auxiliary line 230 does not correspond to a connection-line actually existing in the display panel and is only a virtual line introduced for ease of description.

For example, referring to FIG. 5, FIG. 5 illustrates one first connection-line 210 including a straight line segment FG, a point F is an end point of the straight line segment FG in the region closer to the center O of the first display region 110, and a point G is an end point of the straight line segment FG in the region farther away from the center O of the first display region 110. The midpoint of the straight line segment FG is a point E, and the included angle θ between a straight line segment OE and the straight line segment FG satisfies that θ≤45° Thus, the radial component of the straight line segment included in the first connection-line 210 is greater than the tangential component of the straight line segment.

It is to be noted that the first connection-line 210 may include multiple straight line segments or the first connection-line 210 may include a curved line segment not applicable to the case where the first connection-line 210 includes one straight line segment, as long as the extension direction of the first connection-line 210 is the radial direction of the first display region 110 or the substantially radial direction of the first display region 110.

Figure 6:
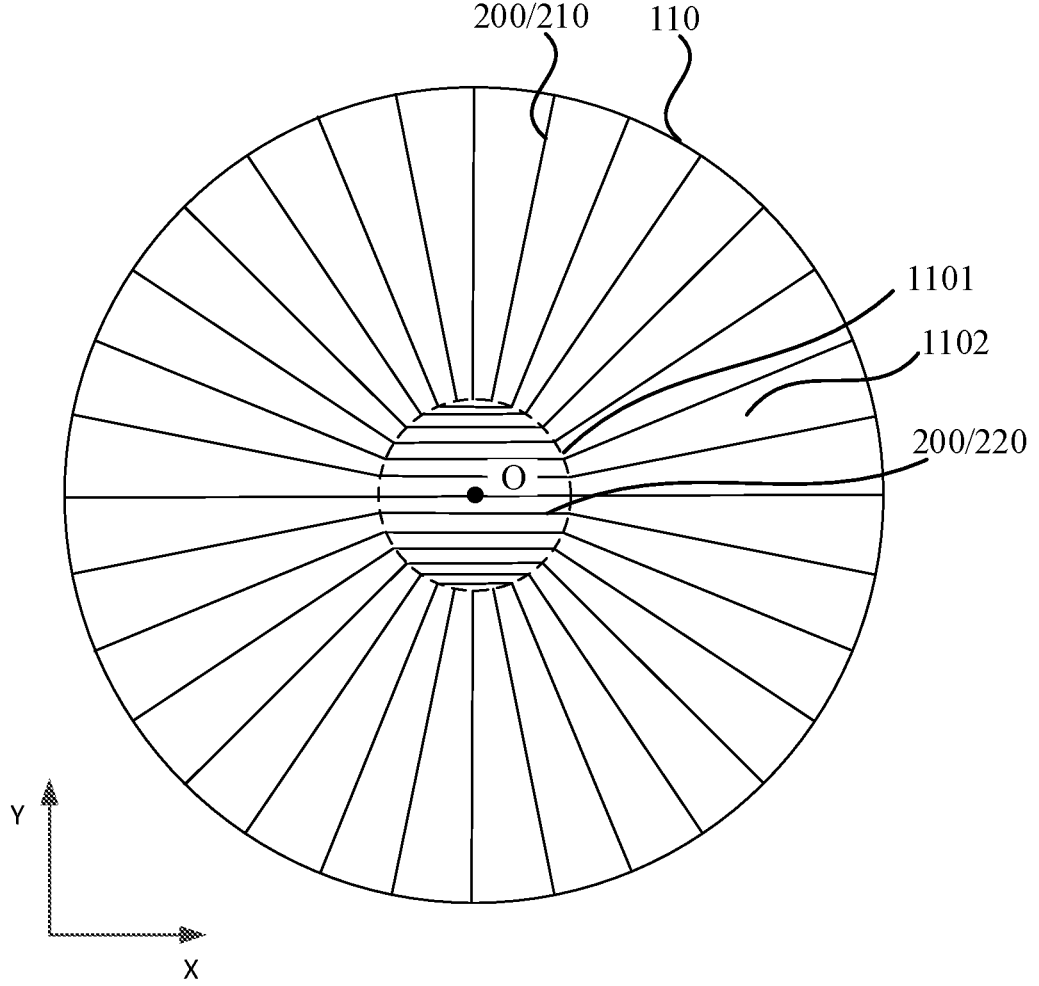
FIG. 6 is another top view of a first display region of the display panel in FIG. 1.

FIG. 6 is another top view of the first display region in FIG. 1. Referring to FIGS. 1 and 6, the first display region 110 includes a central region 1101 and a peripheral region 1102, where the peripheral region 1102 surrounds the central region 1101. The peripheral region 1102 is disposed between the central region 1101 and the second display region 120. The central region 1101 of the first display region 110 may be the same as or different from the region closer to the center O of the first display region 110. The first connection-line 210 is disposed in the peripheral region 1102. The connection-line 200 further includes a second connection-line 220 disposed in the central region 1101. The second connection-line 220 extends along the first direction X and is connected to at least one first connection-line 210, where the first direction X intersects the second direction Y. In other embodiments, the second connection-line 220 may extend along the second direction Y. The larger the inclined viewing angle, the more serious the misalignment caused. The inclined viewing angle for each second connection-line 220 in the central region 1101 is relatively small, and the inclined viewing angle for each first connection-line 210 in the peripheral region 1102 is relatively large. Therefore, in the central region 1101, to reduce wiring difficulty, each second connection-line 220 may be arranged to extend along the first direction X or the second direction Y. In the peripheral region 1102, to reduce the misalignment extent among the connection-lines 200 at the inclined viewing angle, the first connection-lines 210 may be configured to radiate from the center.

Figure 7:
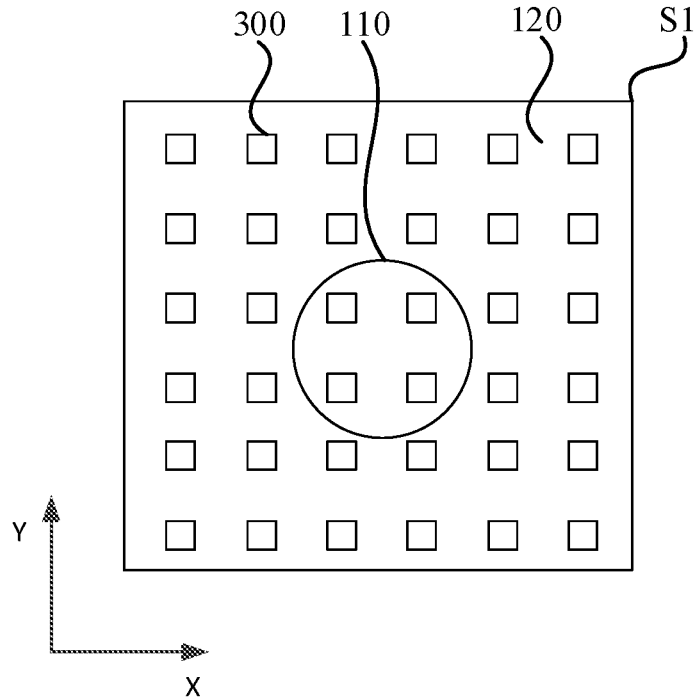
FIG. 7 is a top view of a region S1 of the display panel in FIG. 1.

FIG. 7 is a top view of a region S1 of the display panel in FIG. 1. Referring to FIGS. 1 and 7, the second display region 120 includes multiple pixel units 300, where the multiple pixel units 300 are arranged in an array along the first direction X and the second direction Y. Referring to FIG. 6, the second connection-line 220 extends in a row direction of the pixel units 300, or the second connection-line 220 extends in a column direction of the pixel units 300.

For example, referring to FIG. 7, the multiple pixel units 300 are arranged in the array. Along the first direction X, multiple pixel units 300 are arranged in a row: Along the second direction Y, multiple pixel units 300 are arranged in a column. Along the second direction Y, a pixel unit 300 overlaps a pixel unit 300 in an adjacent row: In some embodiments, two pixel units 300 are aligned in the second direction Y. In some embodiments, the pixel units 300 may be arranged similarly in the first direction X. The details are not repeated here. In other embodiments, the multiple pixel units 300 may be arranged in other manners.

For example, referring to FIG. 7, the first display region 110 includes multiple pixel units 300, where the arrangement of the pixel units 300 in the first display region 110 is the same as the arrangement of the pixel units 300 in the second display region 120. In other embodiments, the arrangement of the pixel units 300 in the first display region 110 is different from the arrangement of the pixel units 300 in the second display region 120.

For example, the pixel unit 300 may include multiple sub-pixels. The connection-line 200 (including the first connection-line 210 and the second connection-line 220) may pass through at least one sub-pixel. A sub-pixel in the first display region 110 is a first sub-pixel and a sub-pixel in the second display region 120 is a second sub-pixel.

Figure 8:
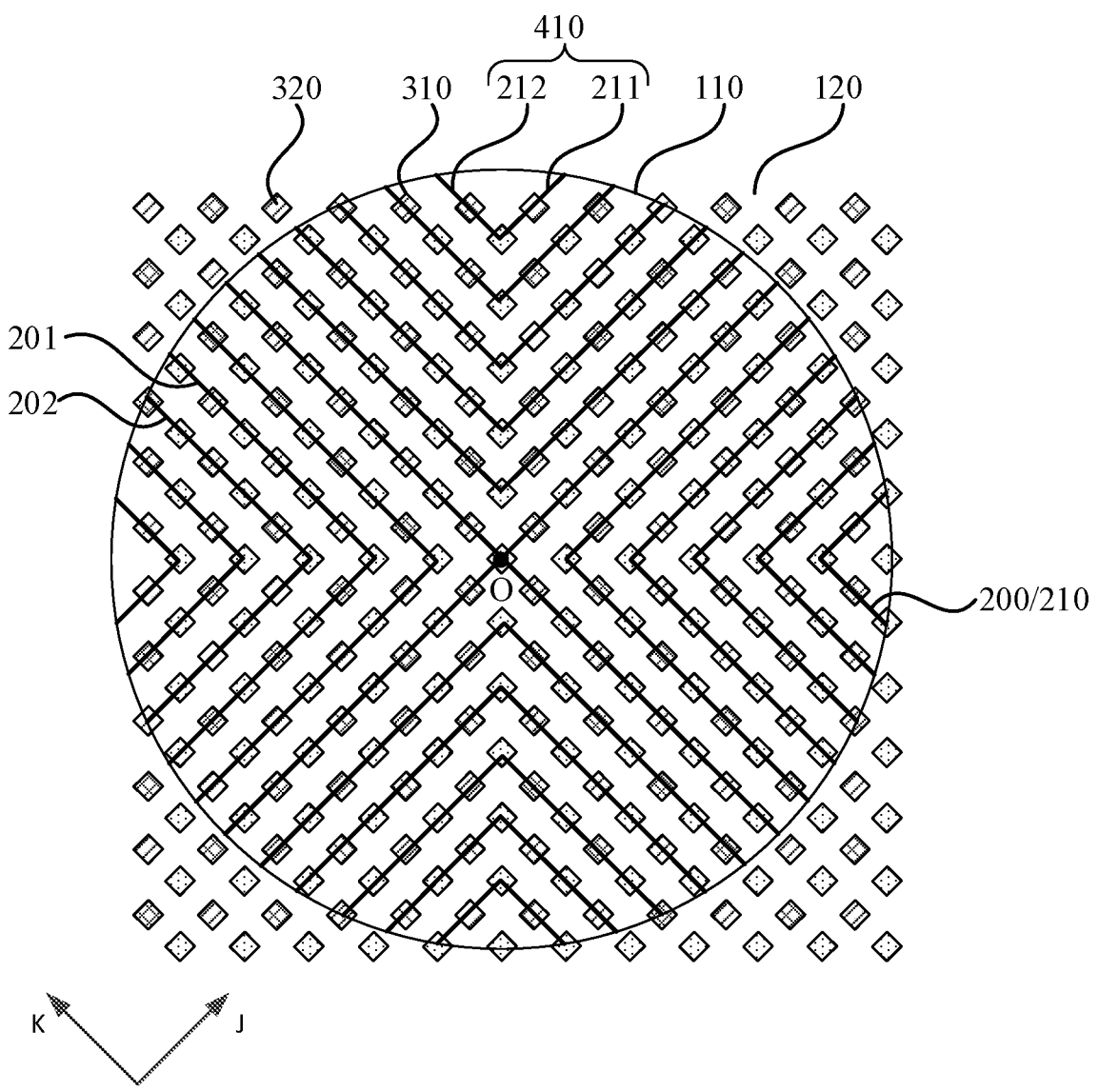
FIG. 8 is another top view of a partial region of a display panel according to an embodiment of the present disclosure.

FIG. 8 is another top view of a partial region of a display panel according to an embodiment of the present disclosure. Referring to FIG. 8, the first display region 110 includes first sub-pixels 310. The first connection-line 210 includes a first sub-connection-line 211 and a second sub-connection-line 212. The first sub-connection-line 211 extends along a third direction J and passes through at least one of the first sub-pixels 310. The second sub-connection-line 212 extends along a fourth direction K and passes through at least one of the first sub-pixels 310. The third direction J intersects the fourth direction K. In the embodiment of the present disclosure, the first sub-connection-line 211 extends along the third direction J, the second sub-connection-line 212 extends along the fourth direction K, and the first connection-lines 210 are arranged to extend along the third direction J and the fourth direction K so that the wiring difficulty is low; and the first connection-lines 210, as a whole, are configured to radiate from the center, reducing the misalignment extent among the connection-lines 200 at the inclined viewing angle.

For example, referring to FIGS. 1 and 8, the first direction X intersects the third direction J and the fourth direction K, and the second direction Y intersects the third direction J and the fourth direction K. As an example, the included angle between the first direction X and the third direction J is 45°, the included angle between the second direction Y and the third direction J is 45°, the included angle between the first direction X and the fourth direction K is 45°, and the included angle between the second direction Y and the fourth direction K is 45°. The first direction X is perpendicular to the second direction Y, and the third direction J is perpendicular to the fourth direction K.

In some embodiments, referring to FIG. 8, the first sub-connection-line 211 and the second sub-connection-line 212 are connected to form a first connection structure 410. In the first display region 110, multiple first connection structures 410 are arranged from the region closer to the center O of the first display region 110 toward the region farther away from the center O of the first display region 110.

For example, referring to FIG. 8, each first connection structure 410 passes through multiple first sub-pixels 310, and the multiple first connection structures 410 pass through all the first sub-pixels 310 in the first display region 110.

For example, referring to FIG. 8, the first connection structure 410 is V-shaped at an included angle of 90°. The first connection structure 410 includes two first connection-lines 210 including the first sub-connection-line 211 and the second sub-connection-line 212. The first sub-connection-line 211 is perpendicular to the second sub-connection-line 212. It is to be understood that in the embodiment of the present disclosure, the first display region 110 is divided into four regions, which are a region where the first connection structure 410 opened toward a right side is located, a region where the first connection structure 410 opened toward an upper side is located, a region where the first connection structure 410 opened toward a left side is located and a region where the first connection structure 410 opened toward a lower side is located, separately.

Figure 9:
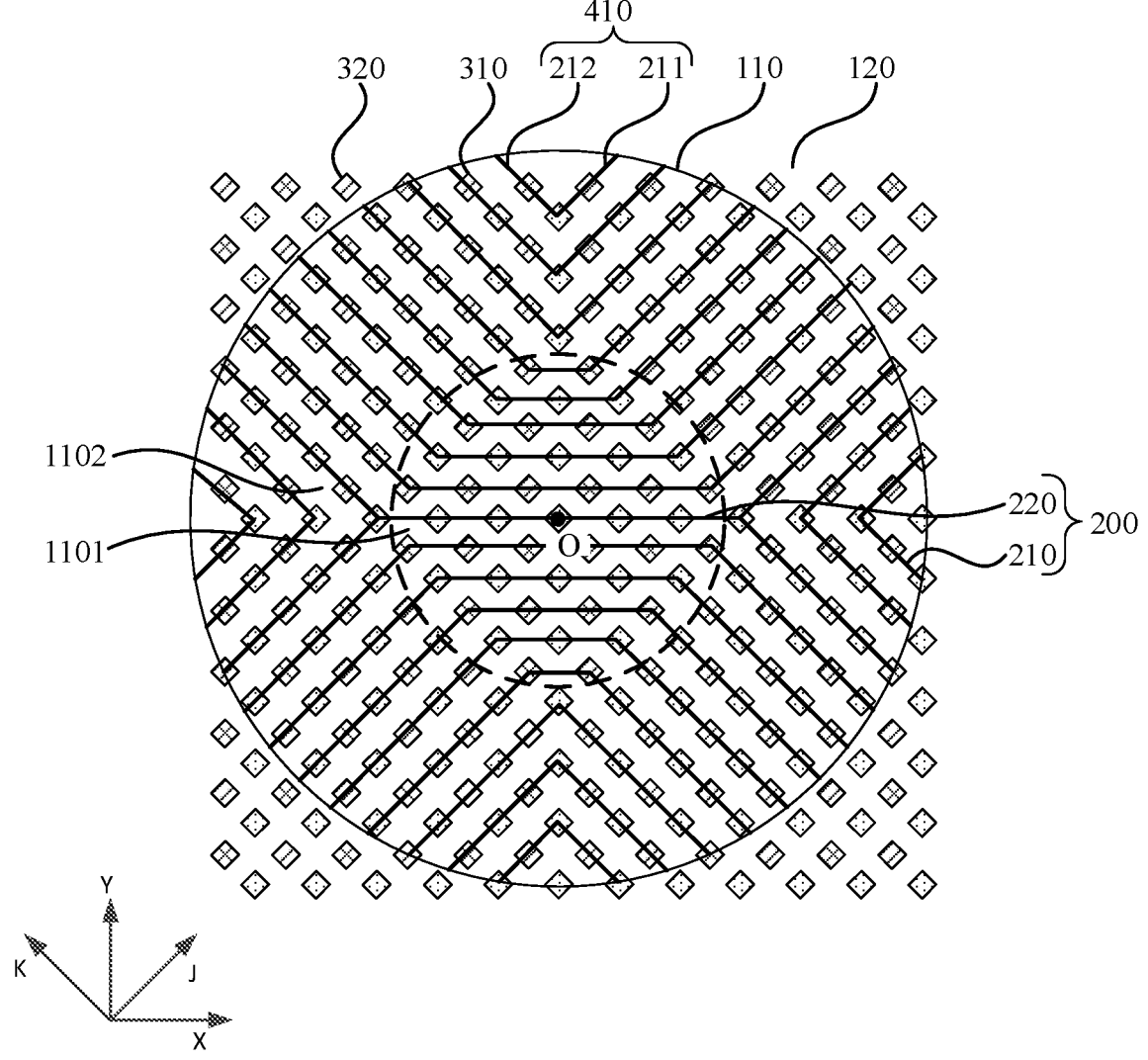
FIG. 9 is another top view of a partial region of a display panel according to an embodiment of the present disclosure.

FIG. 9 is another top view of a partial region of a display panel according to an embodiment of the present disclosure. Referring to FIG. 9, the first sub-connection-line 211 and the second sub-connection-line 212 are both disposed in the peripheral region 1102. The second connection-line 220 is disposed in the central region 1101. The second connection-line 220 extends along the first direction X, one end of the second connection-line 220 is connected to the first sub-connection-line 211, and the other end of the second connection-line 220 is connected to the second sub-connection-line 212.

Figure 10:
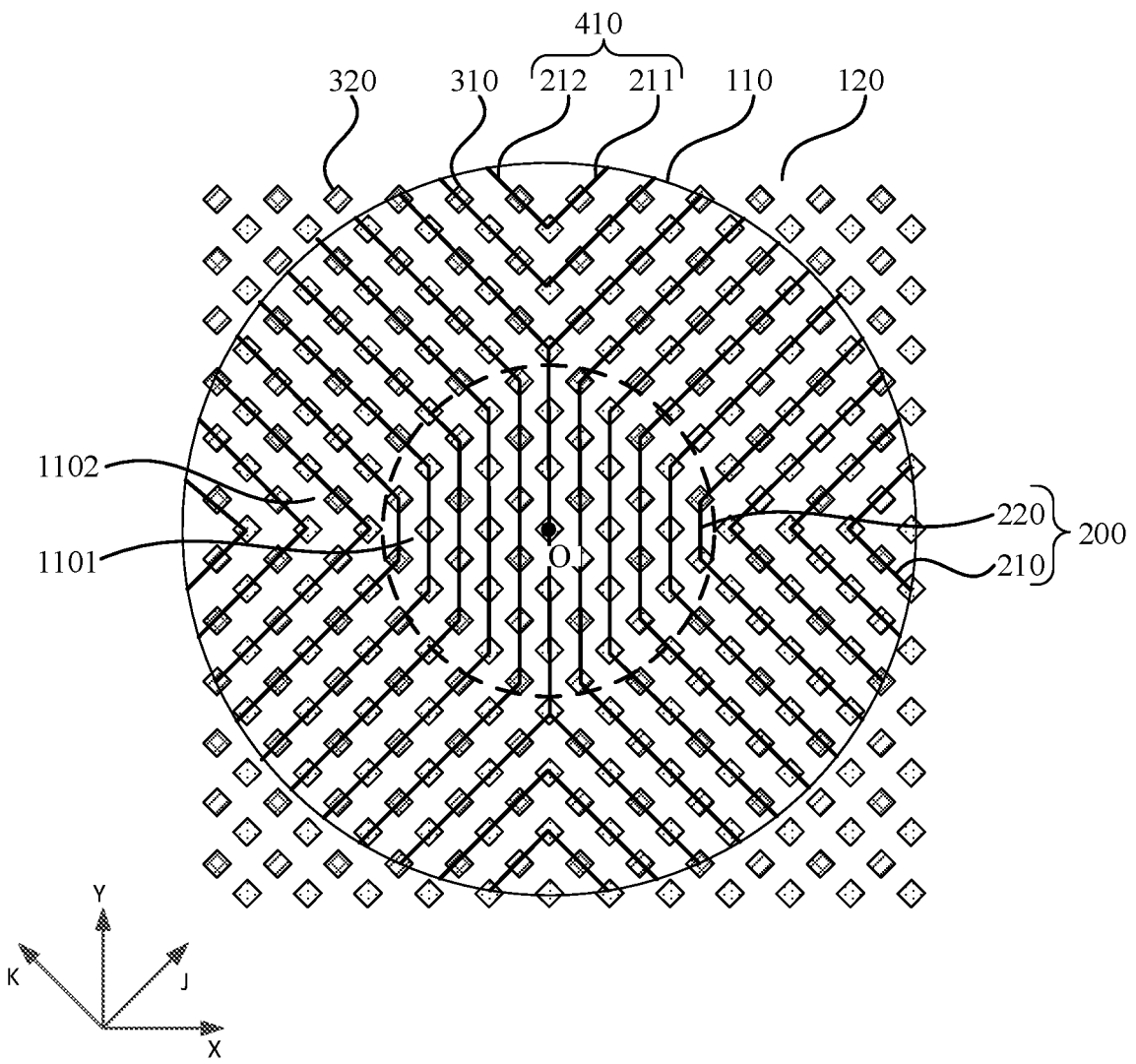
FIG. 10 is another top view of a partial region of a display panel according to an embodiment of the present disclosure.

FIG. 10 is another top view of a partial region of a display panel according to an embodiment of the present disclosure. Referring to FIG. 10. FIG. 10 is different from FIG. 9 in that the second connection-line 220 extends along the second direction Y. There exists a second connection-line 220) connected to two first sub-connection-lines 211 and two second sub-connection-lines 212. In summary, at least one end of the second connection-line 220 needs to be connected to at least one first connection-line 210.

Figure 11:
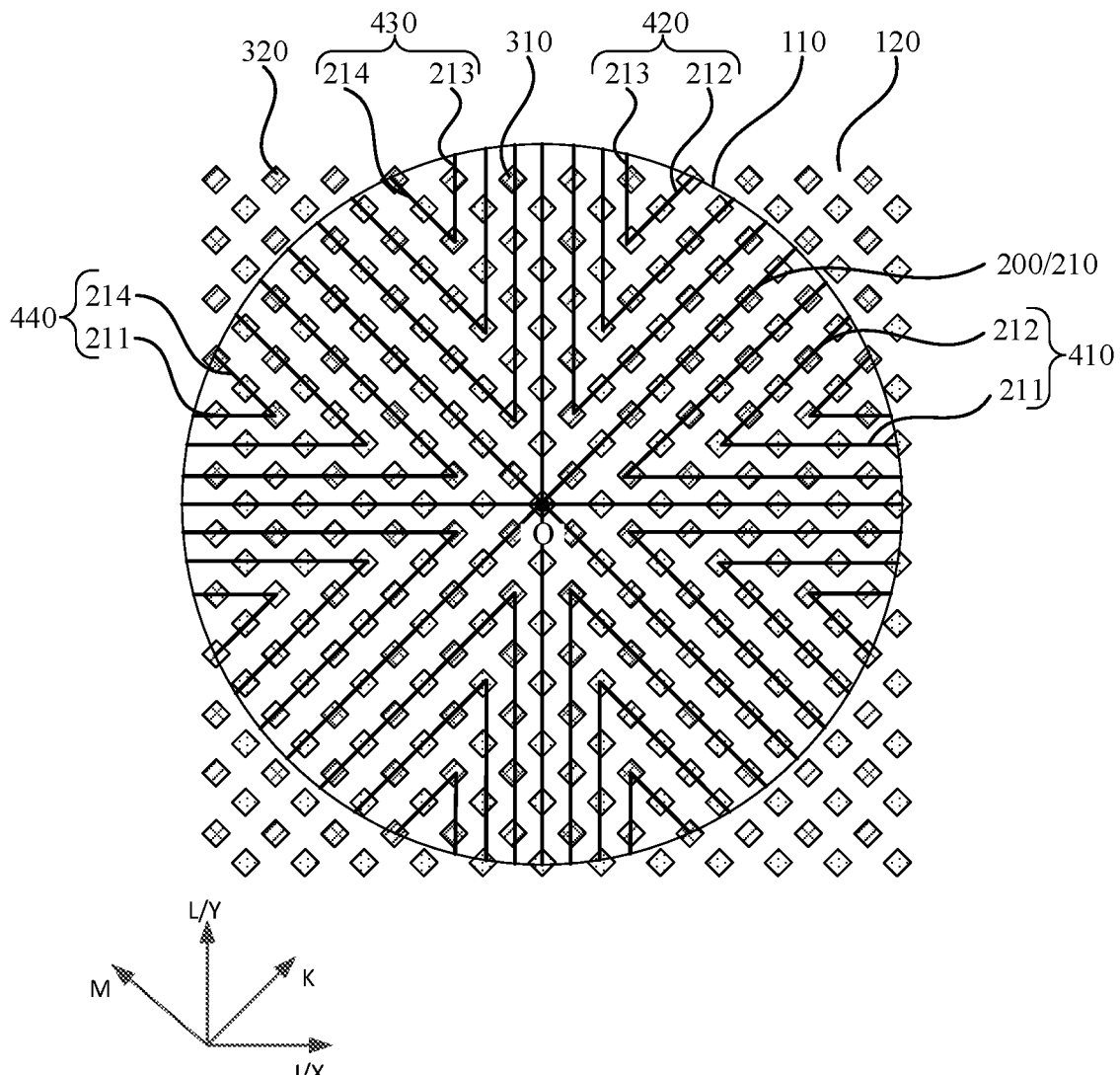
FIG. 11 is another top view of a partial region of a display panel according to an embodiment of the present disclosure.

FIG. 11 is another top view of a partial region of a display panel according to an embodiment of the present disclosure. Referring to FIG. 11, the first connection-line 210 includes a first sub-connection-line 211, a second sub-connection-line 212, a third sub-connection-line 213 and a fourth subconnection-line 214. The first sub-connection-line 211 extends along a third direction J and passes through at least one of the first sub-pixels 310. The second sub-connection-line 212 extends along a fourth direction K and passes through at least one of the first sub-pixels 310. The third sub-connection-line 213 extends along a fifth direction L and passes through at least one of the first sub-pixels 310. The fourth sub-connection-line 214 extends along a sixth direction M and passes through at least one of the first sub-pixels 310. Any two of the third direction J, the fourth direction K, the fifth direction L and the sixth direction M intersect. The second sub-connection-line 212 and the third sub-connection-line 213 are connected to form a second connection structure 420, the third sub-connection-line 213 and the fourth sub-connection-line 214 are connected to form a third connection structure 430, and the fourth sub-connection-line 214 and the first sub-connection-line 211 are connected to form a fourth connection structure 440. Multiple second connection structures 420 are arranged from the region closer to the center O of the first display region 110 toward the region farther away from the center O of the first display region 110. Multiple third connection structures 430 are arranged from the region closer to the center O of the first display region 110 toward the region farther away from the center O of the first display region 110. Multiple fourth connection structures 440 are arranged from the region closer to the center O of the first display region 110 toward the region farther away from the center O of the first display region 110. In the embodiment of the present disclosure, the first sub-connection-line 211 extends along the third direction J, the second sub-connection-line 212 extends along the fourth direction K, the third sub-connection-line 213 extends along the fifth direction L, the fourth sub-connection-line 214 extends along the sixth direction M, and the first connection-lines 210 are arranged to extend along the third direction J, the fourth direction K, the fifth direction L, and the sixth direction M, so that the extension direction of each first connection-line 210 can approximate more to the radial direction of the first display region 110, to increase the consistency of the extension direction of the first connection-line 210 with the direction in which the viewing angle increases and reduce the misalignment extent among the connection-lines 200 at the inclined viewing angle.

For example, referring to FIGS. 1 and 11, the first direction X is parallel to the third direction J and the second direction Y is parallel to the fifth direction L. The first direction X intersects the fourth direction K and the sixth direction M, and the second direction Y intersects the fourth direction K and the sixth direction M. As an example, the included angle between the third direction J and the fourth direction K is 45°, the included angle between the fourth direction K and the fifth direction L is 45°, the included angle between the fifth direction L and the sixth direction M is 45°, and the included angle between the sixth direction M and the third direction J is 45°.

For example, referring to FIG. 11, each first connection structure 410 passes through multiple first sub-pixels 310, each second connection structure 420 passes through multiple first sub-pixels 310, each third connection structure 430 passes through multiple first sub-pixels 310, and each fourth connection structure 440 passes through multiple first sub-pixels 310. The multiple first connection structures 410, the multiple second connection structures 420, the multiple third connection structures 430) and the multiple fourth connection structures 440) collectively pass through all the first sub-pixels 310 in the first display region 110.

For example, referring to FIG. 11, each of the first connection structure 410, the second connection structure 420, the third connection structure 430) and the fourth connection structure 440 is V-shaped at an included angle of 45°. The first connection structure 410 includes two first connection-lines 210 including the first sub-connection-line 211 and the second sub-connection-line 212. The included angle between the first sub-connection-line 211 and the second sub-connection-line 212 is 45°. Similarly, the second connection structure 420 includes the second sub-connection-line 212 and the third sub-connection-line 213, and the included angle between the second sub-connection-line 212 and the third sub-connection-line 213 is 45°. The third connection structure 430) includes the third sub-connection-line 213 and the fourth sub-connection-line 214, and the included angle between the third sub-connection-line 213 and the fourth sub-connection-line 214 is 45°. The fourth connection structure 440) includes the fourth sub-connection-line 214 and the first sub-connection-line 211, and the included angle between the fourth sub-connection-line 214 and the first sub-connection-line 211 is 45°. It is to be understood that in the embodiment of the present disclosure, the first display region 110 is divided into eight regions, which are a region where the first connection structure 410 opened toward an upper right side is located, a region where the second connection structure 420 opened toward the upper right side is located, a region where the third connection structure 430 opened toward an upper left side is located, a region where the fourth connection structure 440 opened toward the upper left side is located, a region where the first connection structure 410 opened toward a lower left side is located, a region where the second connection structure 420 opened toward the lower left side is located, a region where the third connection structure 430 opened toward a lower right side is located and a region where the fourth connection structure 440 opened toward the lower right side is located, separately.

Figure 12:
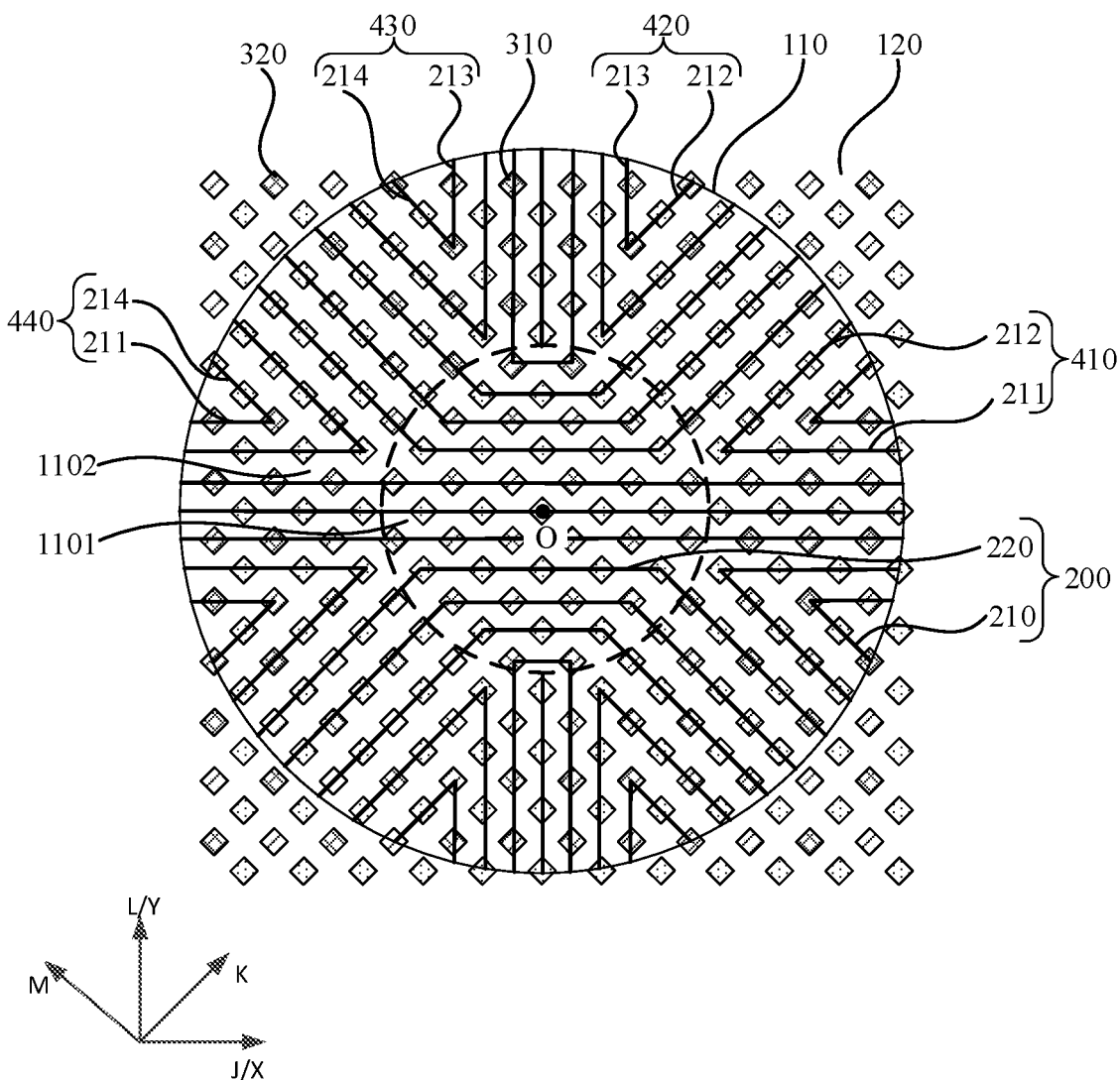
FIG. 12 is another top view of a partial region of a display panel according to an embodiment of the present disclosure.

FIG. 12 is another top view of a partial region of a display panel according to an embodiment of the present disclosure. Referring to FIG. 12, the first sub-connection-line 211, the second sub-connection-line 212, the third sub-connection-line 213 and the fourth sub-connection-line 214 are all disposed in the peripheral region 1102. The second connection-line 220 is disposed in the central region 1101. The second connection-line 220 extends along the first direction X, and the second connection-line 220 is connected to at least one of the first sub-connection-line 211, the second sub-connection-line 212, the third sub-connection-line 213 or the fourth sub-connection-line 214, that is, at least one end of the second connection-line 220 needs to be connected to at least one first connection-line 210.

In some embodiments, referring to FIG. 8, the first connection-line 210 includes a first-type connection-line 201 and a second-type connection-line 202. The distance between the center O of the first display region 110 and an end of the first-type connection-line 201 facing the center O of the first display region 110 is smaller than the distance between the center O of the first display region 110 and an end of the second-type connection-line 202 facing the center O of the first display region 110. That is to say, the first connection-line 210 whose end portion is closer to the center O of the first display region 110 is referred to as the first-type connection-line 201, and the first connection-line 210 whose end portion is relatively far from the center O of the first display region 110 is referred to as the second-type connection-line 202. The number of first sub-pixels 310 through which the first-type connection-line 201 passes is greater than the number of first sub-pixels 310 through which the second-type connection-line 202 passes. In the embodiment of the present disclosure, the closer the end portion of the first connection-line 210) is to the center O of the first display region 110, the more first sub-pixels 310 the first connection-line 210 passes through: the farther the end portion of the first connection-line 210 is from the center O of the first display region 110, the fewer first sub-pixels 310 the first connection-line 210 passes through.

It is to be noted that the arrangement of the pixel units (including sub-pixels) is not limited in the present disclosure as long as the first connection-line 210 passes through at least one first sub-pixel 310.

Figure 13:
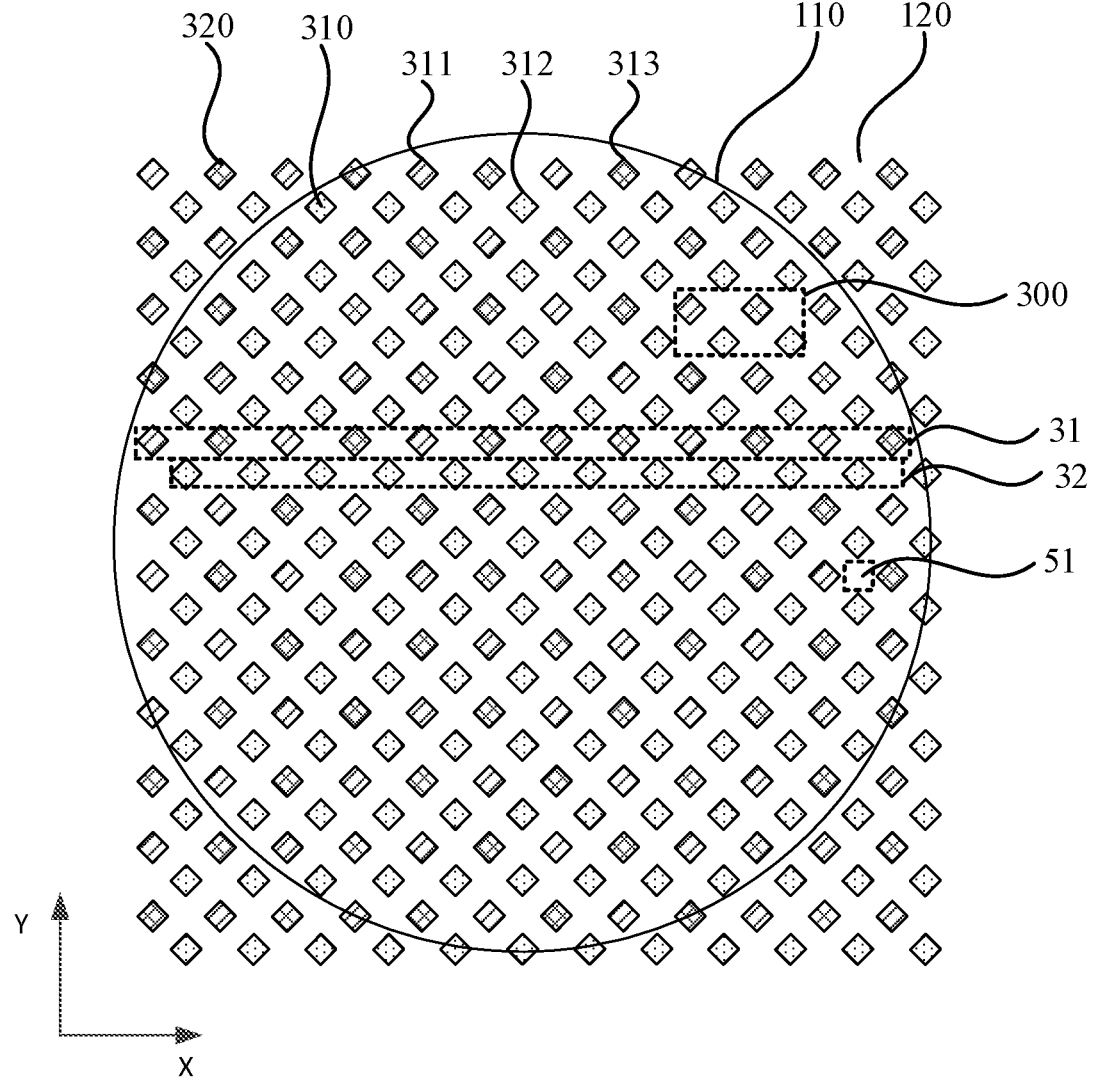
FIG. 13 is another top view of a partial region of a display panel according to an embodiment of the present disclosure.

FIG. 13 is another top view of a partial region of a display panel according to an embodiment of the present disclosure. Referring to FIG. 13, the first display region 110 includes a first sub-pixel row 31 and a second sub-pixel row 32. The first sub-pixel row 31 and the second sub-pixel row 32 each extend along the first direction X. The first sub-pixel row 31 and the second sub-pixel row 32 each include multiple first sub-pixels 310. Along the second direction Y, two adjacent first sub-pixel rows 31 are spaced by one second sub-pixel row 32 and two adjacent second sub-pixel rows 32 are spaced by one first sub-pixel row 31. Along the second direction Y, the first sub-pixel row 31 and the second sub-pixel row 32 are arranged by turns. The first sub-pixels 310 include a first-color sub-pixel 311, a second-color sub-pixel 312, and a third-color sub-pixel 313. Any two of the first-color sub-pixel 311, the second-color sub-pixel 312 and the third-color sub-pixel 313 have different emitted colors. In the first sub-pixel row 31, two adjacent first-color sub-pixels 311 are spaced by one third-color sub-pixel 313, two adjacent third-color sub-pixels 313 are spaced by one first-color sub-pixel 311, and the first-color sub-pixel 311 and the third-color sub-pixel 313 are arranged by turns. A first gap 51 exists between the first-color sub-pixel 311 and the third-color sub-pixel 313 adjacent to each other. The second sub-pixel row 32 includes multiple second-color sub-pixels 312. The second-color sub-pixel 312 overlaps the first gap 51 along the second direction Y.

For example, referring to FIG. 13, the pixel unit 300 includes the first-color sub-pixel 311, two second-color sub-pixels 312 and the third-color sub-pixel 313. In the same pixel unit 300, the first-color sub-pixel 311 and the third-color sub-pixel 313 are disposed in the same first sub-pixel row 31 and the two second-color sub-pixels 312 are disposed in the same second sub-pixel row 32. Color display is implemented through a mixture of light emitted by the first-color sub-pixel 311, the second-color sub-pixels 312 and the third-color sub-pixel 313 in the same pixel unit 300.

For example, referring to FIG. 13, the arrangement of the pixel units 300 in the first display region 110 is the same as the arrangement of the pixel units 300 in the second display region 120. The arrangement of the first sub-pixels 310 in the first display region 110 is the same as the arrangement of second sub-pixels 320 in the second display region 120. Therefore, the first display region 110 and the second display region 120 have the same sub-pixel arrangement, which facilitates the improvement of display consistency.

For example, referring to FIG. 13, the first-color sub-pixel 311 emits red light, the second-color sub-pixel 312 emits green light, and the third-color sub-pixel 313 emits blue light.

Figure 14:
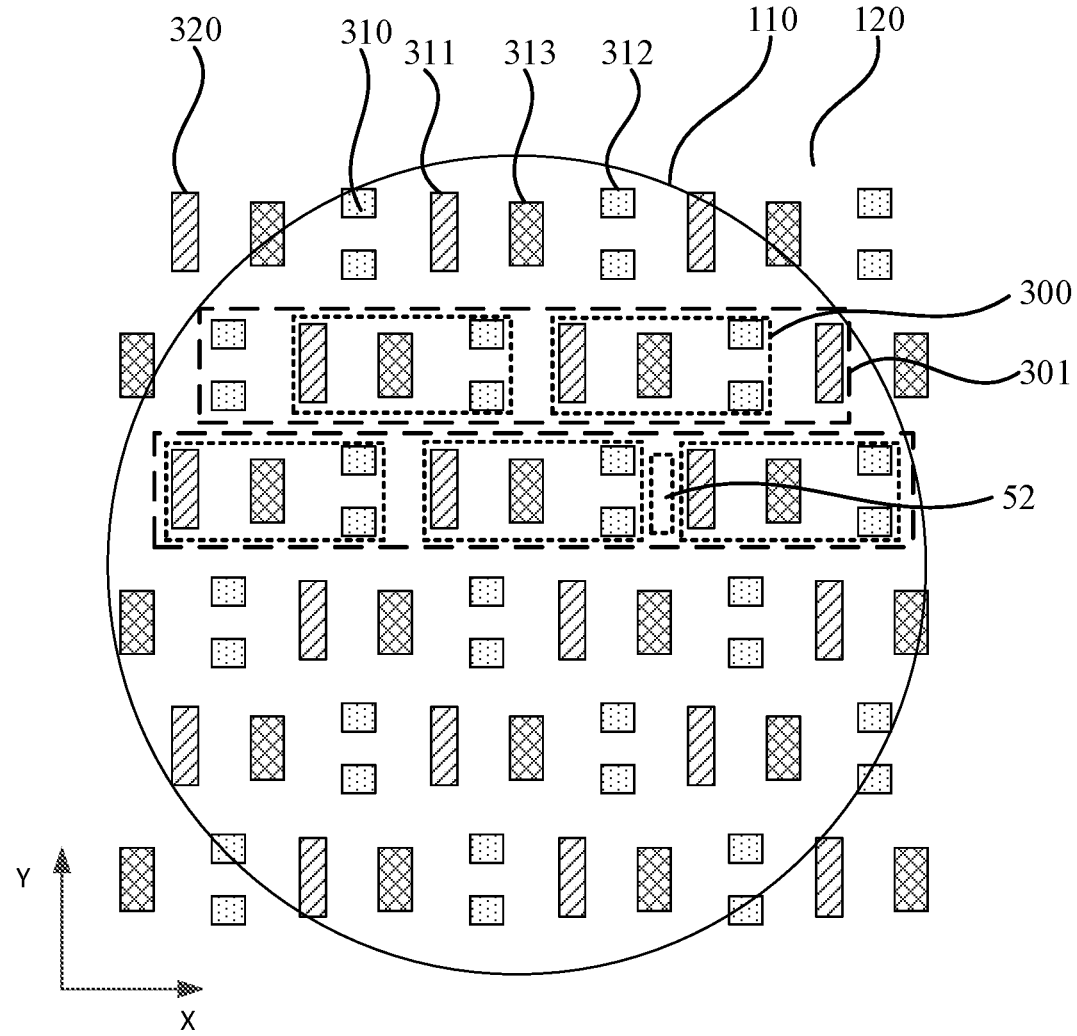
FIG. 14 is another top view of a partial region of a display panel according to an embodiment of the present disclosure.

FIG. 14 is another top view of a partial region of a display panel according to an embodiment of the present disclosure. Referring to FIG. 14, the first display region 110 includes multiple pixel unit rows 301 extending along the first direction X. The multiple pixel unit rows 301 are arranged along the second direction Y. Each pixel unit row 301 includes multiple pixel units 300. In each pixel unit row 301, a second gap 52 exists between two adjacent pixel units 300. Along the second direction Y, each pixel unit 300 overlaps the second gap 52 in a pixel unit row 301 adjacent to each pixel unit 300. That is to say, pixel units 300 in two adjacent rows are staggered. The pixel unit 300 includes the first sub-pixel 310 including the first-color sub-pixel 311, the second-color sub-pixel 312 and the third-color sub-pixel 313. Any two of the first-color sub-pixel 311, the second-color sub-pixel 312 and the third-color sub-pixel 313 have different emitted colors. In the same pixel unit 300, the first-color sub-pixel 311, the third-color sub-pixel 313 and the second-color sub-pixel 312 are arranged along the first direction X. Along the first direction X, the third-color sub-pixel 313 is disposed between the first-color sub-pixel 311 and the second-color sub-pixel 312. In the same pixel unit 300, two second-color sub-pixels 312 are arranged along the second direction Y. The arrangement of the pixel units (including sub-pixels) provided in the embodiment of the present disclosure is also applicable to the arrangements of the connection-lines 200 in the preceding embodiments.

Figure 15:
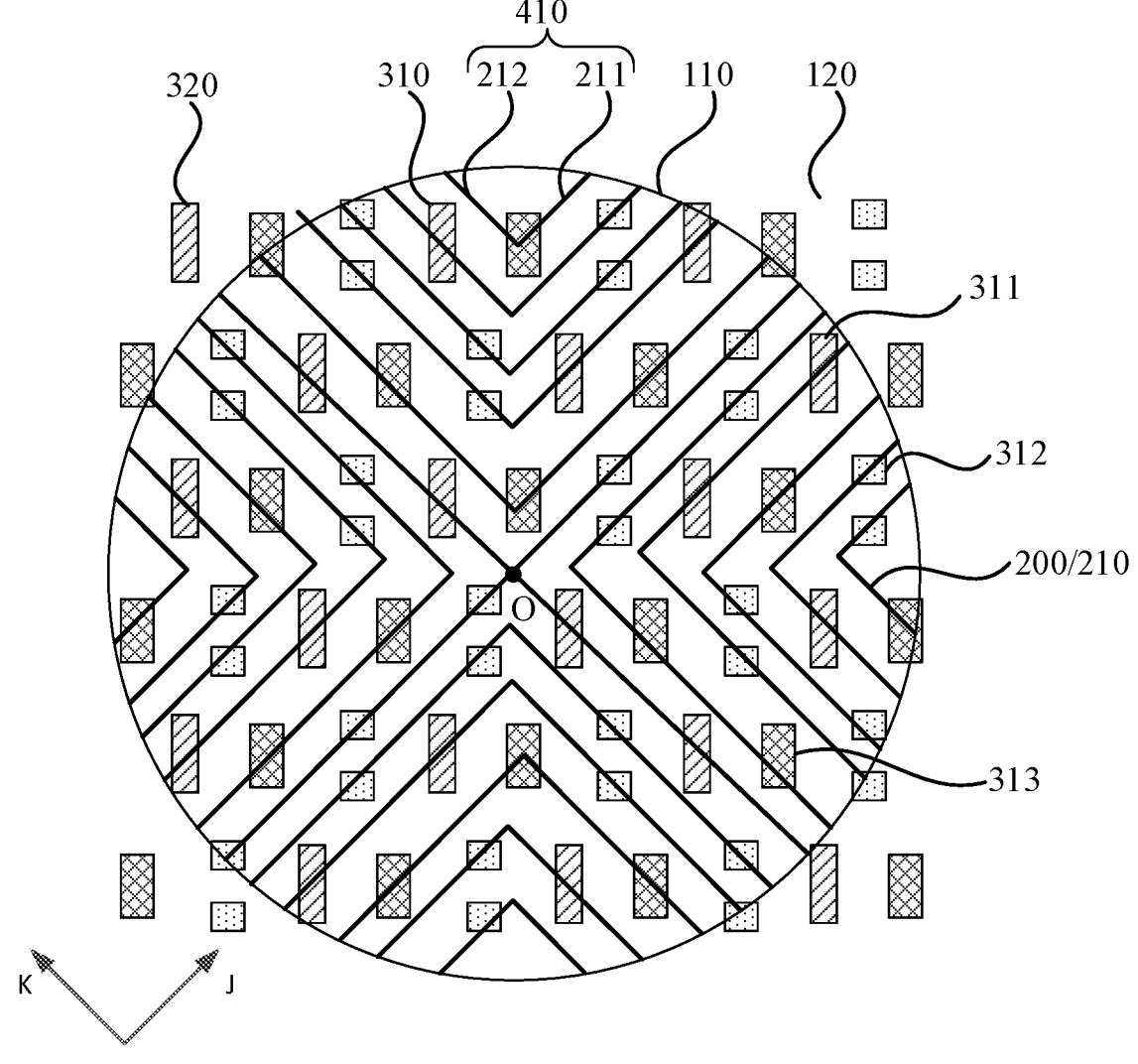
FIG. 15 is another top view of a partial region of a display panel according to an embodiment of the present disclosure.

FIG. 15 is another top view of a partial region of a display panel according to an embodiment of the present disclosure. Referring to FIG. 15, the first display region 110 includes the first sub-pixels 310. The first connection-line 210) includes the first sub-connection-line 211 and the second sub-connection-line 212. The first sub-connection-line 211 and the second sub-connection-line 212 are connected to form the first connection structure 410. In the first display region 110, multiple first connection structures 410 are arranged from the region closer to the center O of the first display region 110 toward the region farther away from the center O of the first display region 110. Each first connection structure 410 passes through multiple first sub-pixels 310, and the multiple first connection structures 410 pass through all the first sub-pixels 310 in the first display region 110.

Figure 16:
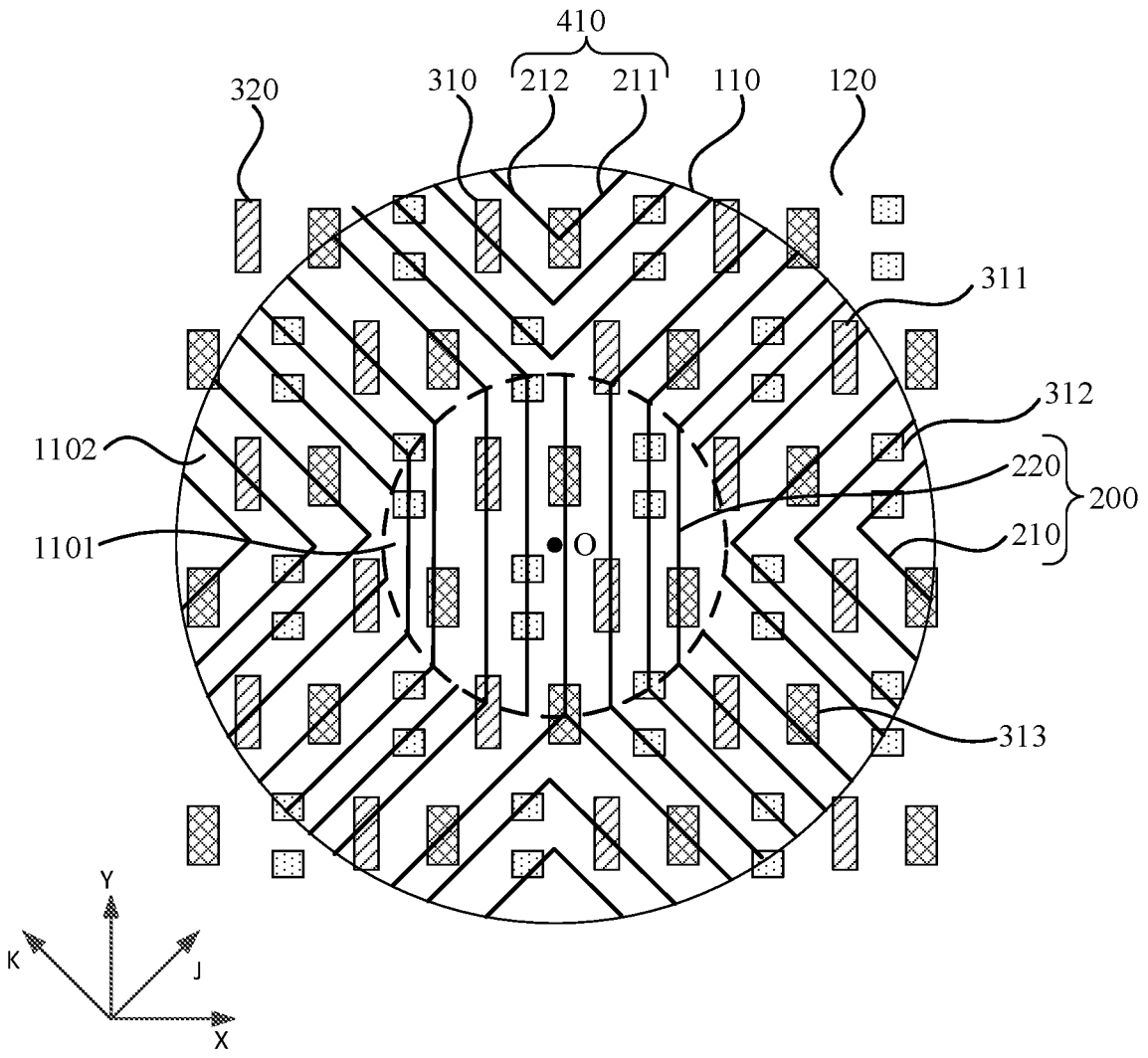
FIG. 16 is another top view of a partial region of a display panel according to an embodiment of the present disclosure.

FIG. 16 is another top view of a partial region of a display panel according to an embodiment of the present disclosure. Referring to FIG. 16, the first sub-connection-line 211 and the second sub-connection-line 212 are both disposed in the peripheral region 1102. The second connection-line 220 is disposed in the central region 1101. The second connection-line 220 extends along the second direction Y, one end of the second connection-line 220 is connected to the first sub-connection-line 211, and the other end of the second connection-line 220 is connected to the second sub-connection-line 212. There exists a second connection-line 220 whose end is connected to both the first sub-connection-line 211 and the second sub-connection-line 212.

Figure 17:
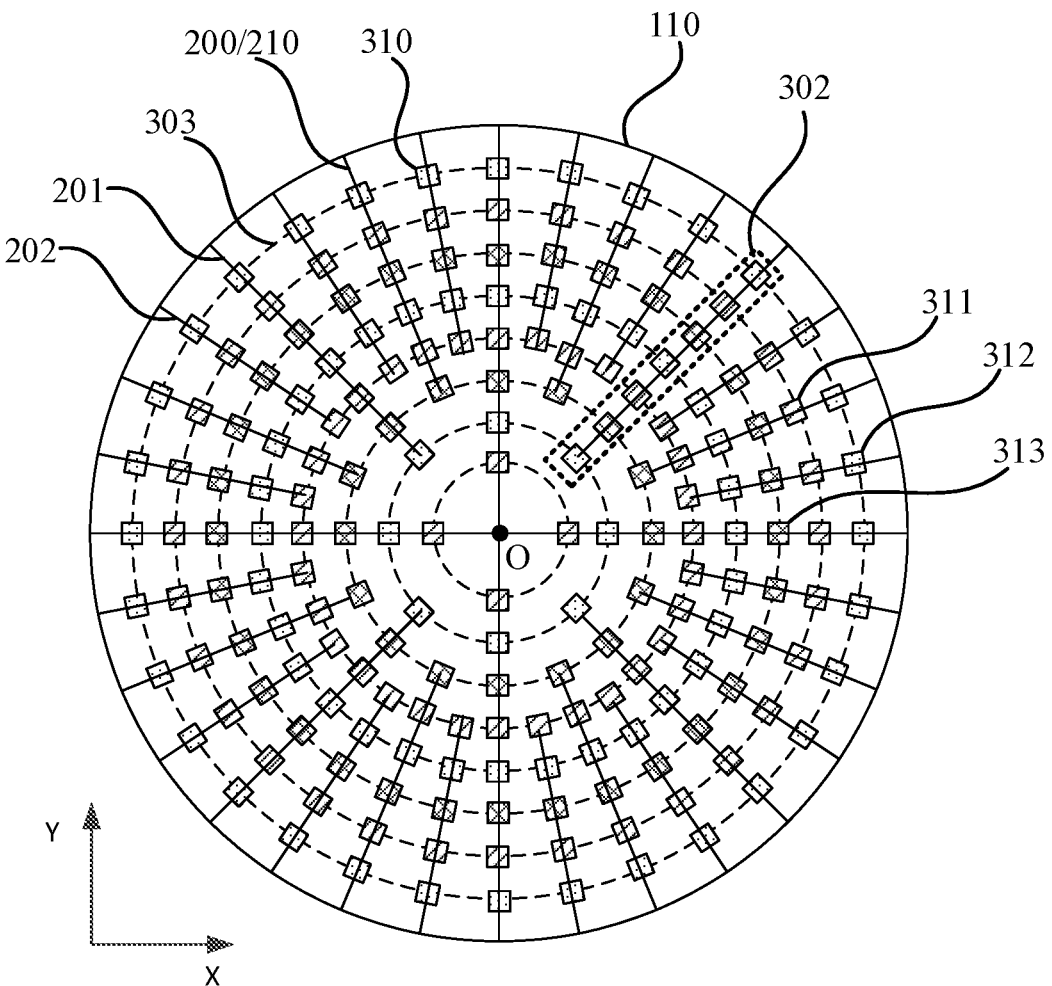
FIG. 17 is another top view of a first display region according to an embodiment of the present disclosure.

FIG. 17 is another top view of a first display region according to an embodiment of the present disclosure. Referring to FIG. 17, the first display region 110 includes multiple first sub-pixel strings 302. Each first sub-pixel string 302 includes multiple first sub-pixels 310. The multiple first sub-pixels 310 in the first sub-pixel string 302 are disposed on a path of the same first connection-line 210. The first connection-line 210 passes through all the first sub-pixels 310 in the first sub-pixel string 302. An extension line of the first sub-pixel string 302 passes through the center O of the first display region 110. In the embodiment of the present disclosure, for the radiating first connection-lines 210, the arrangement of the first sub-pixels 310 in the first display region 110 is set correspondingly so that the first sub-pixel strings 302 each formed by the multiple first sub-pixels 310 also radiate. Thus, an arrangement direction of the first sub-pixels 310 in the first sub-pixel string 302 and the extension direction of the first connection-line 210 are both the radial direction of the first display region 110 and the arrangement direction of the first sub-pixels 310 in the first sub-pixel string 302 is consistent with the extension direction of the first connection-line 210 so that it is convenient for the radiating first connection-lines 210 to pass through all the first sub-pixels 310 in the first display region 110. Therefore, the number of first sub-pixels 310 connected in series on each first connection-line 210 can be the same as much as possible, thereby avoiding a load difference and improving display uniformity.

Referring to FIG. 17, the first sub-pixel strings 302 each formed by the multiple first sub-pixels 310 radiate, the first connection-lines 210 radiate, and the first connection-lines 210) radiate from the center in the first display region 110 and extend from the region closer to the center O of the first display region 110 toward the region farther away from the center O of the first display region 110 in the radial direction of the first display region 110 or the substantially radial direction of the first display region 110. Such an arrangement is consistent with the fact that with the center O of the first display region as the center of the viewing angle, the further away from the center O of the first display region, the larger the viewing angle. The misalignment extent among the connection-lines 200 at the inclined viewing angle is reduced. Additionally, since the drifts of the connection-lines 200 with different heights have a relatively small difference, no gap exists between the connection-lines 200 with different heights at the inclined viewing angle, thereby avoiding diffraction.

In some embodiments, referring to FIG. 17, the first sub-pixel 310 includes the first-color sub-pixel 311, the second-color sub-pixel 312 and the third-color sub-pixel 313, where any two of the first-color sub-pixel 311, the second-color sub-pixel 312 and the third-color sub-pixel 313 have different emitted colors. The first-color sub-pixel 311, the second-color sub-pixel 312 and the third-color sub-pixel 313 are sequentially arranged in the same first sub-pixel string 302. In the same first sub-pixel string 302, the second-color sub-pixel 312 is disposed between the first-color sub-pixel 311 and the third-color sub-pixel 313, the third-color sub-pixel 313 is disposed between the second-color sub-pixel 312 and the first-color sub-pixel 311, and the first-color sub-pixel 311 is disposed between the third-color sub-pixel 313 and the second-color sub-pixel 312.

For example, referring to FIG. 17, multiple first sub-pixels 310 with the same distance from the center O of the first display region 110 are disposed on the same pixel ring 303. The first-color sub-pixel 311 and the second-color sub-pixel 312 are disposed on two different pixel rings 303 separately, the second-color sub-pixel 312 and the third-color sub-pixel 313 are disposed on two different pixel rings 303 separately, and the first-color sub-pixel 311 and the third-color sub-pixel 313 are disposed on two different pixel rings 303 separately.

Figure 18:
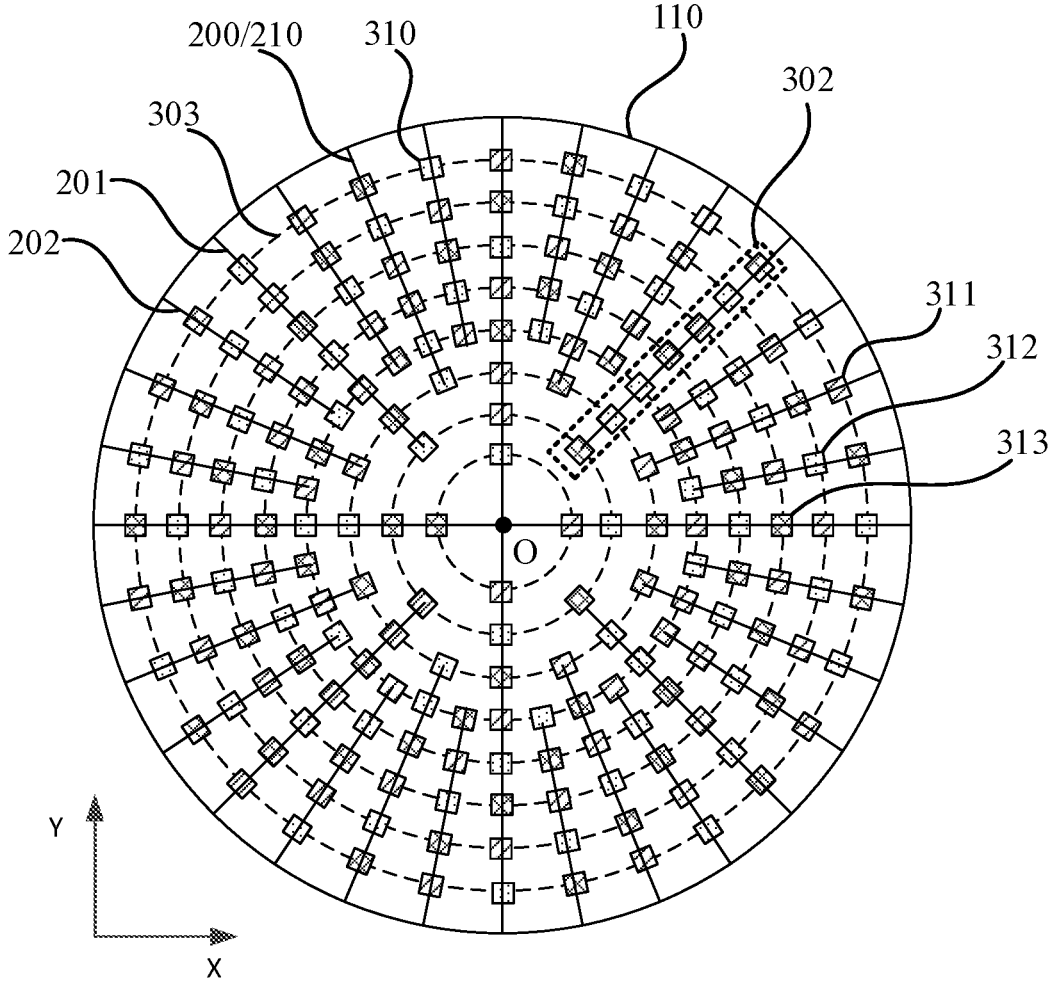
FIG. 18 is another top view of a first display region according to an embodiment of the present disclosure.

FIG. 18 is another top view of a first display region according to an embodiment of the present disclosure. Referring to FIG. 18, multiple first sub-pixels 310 with the same distance from the center O of the first display region 110 are disposed on the same pixel ring 303. The first-color sub-pixel 311, the second-color sub-pixel 312 and the third-color sub-pixel 313 are sequentially arranged in the same pixel ring 303. With such an arrangement, along the radial direction of the first display region 110, the first-color sub-pixel 311, the second-color sub-pixel 312 and the third-color sub-pixel 313 are substantially arranged in sequence in the same first sub-pixel string 302. The distribution of first sub-pixels 310 of only one color is replaced with a relatively uniform distribution of the first-color sub-pixel 311, the second-color sub-pixel 312 and the third-color sub-pixel 313 along the radial direction of the first display region 110. Therefore, such a sub-pixel arrangement is conducive to improving the display uniformity of the first display region 110.

In some embodiments, referring to FIGS. 17 and 18, the number of first sub-pixel strings 302 overlapping the pixel ring 303 gradually increases in a direction from the region closer to the center O of the first display region 110 toward the region farther away from the center O of the first display region 110. In the embodiment of the present disclosure, the number of first sub-pixel strings 302 increases and the number of first sub-pixels 310 increases from inside to outside so that the distribution uniformity of the first sub-pixels 310 in the first display region 110 is improved as a whole, improving the display uniformity of the first display region 110.

In some embodiments, referring to FIGS. 17 and 18, the first connection-line 210 includes the first-type connection-line 201 and the second-type connection-line 202. The distance between the center O of the first display region 110 and the end of the first-type connection-line 201 facing the center O of the first display region 110 is smaller than the distance between the center O of the first display region 110 and the end of the second-type connection-line 202 facing the center O of the first display region 110. In the embodiment of the present disclosure, the closer the end portion of the first connection-line 210 is to the center O of the first display region 110, the more first sub-pixels 310 the first connection-line 210 passes through: the farther the end portion of the first connection-line 210 is from the center O of the first display region 110, the fewer first sub-pixels 310 the first connection-line 210 passes through.

For example, referring to FIGS. 17 and 18, first connection-lines 210 connecting different numbers of first sub-pixels 310 in series may be arranged periodically. The first connection-lines 210 are arranged along a circumferential direction around the center O of the first display region 110. The first connection-line 210 includes the first-type connection-line, the second-type connection-line, . . . , and the N-th type of connection-line. The first-type connection-line, the second-type connection-line, . . . , and the N-th type of connection-line are arranged sequentially and alternatively, in a cyclic manner. In this manner, wires with different loads can be uniformly distributed, improving the display uniformity of display panel.

Figure 19:
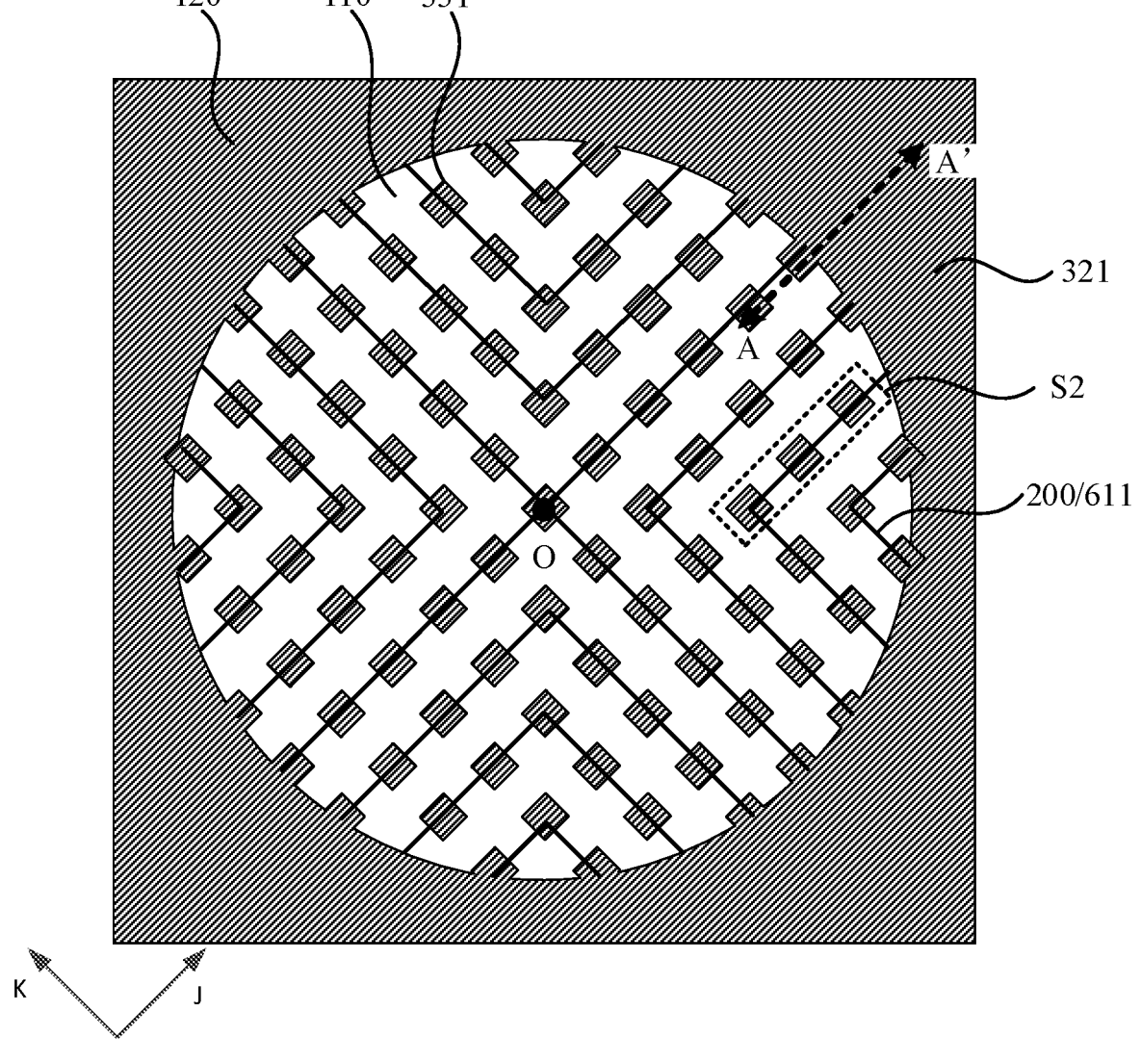
FIG. 19 is another top view of a partial region of a display panel according to an embodiment of the present disclosure.
Figure 20:
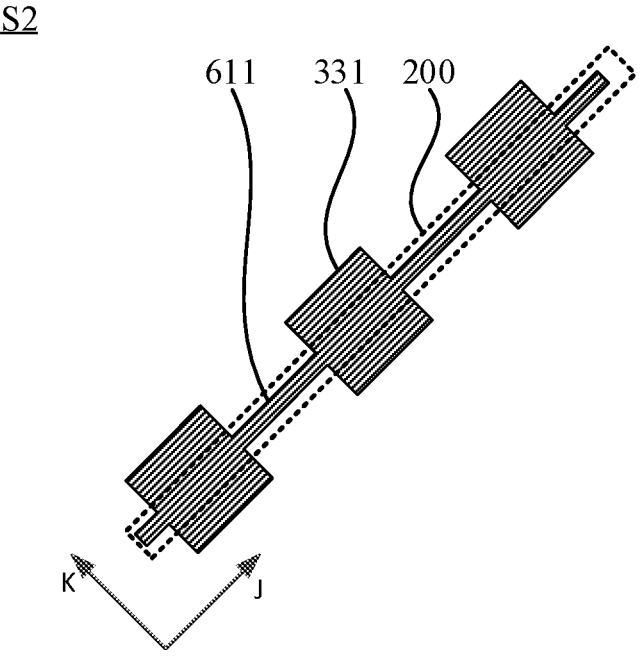
FIG. 20 is a top view of a region S2 of the display panel in FIG. 19.
Figure 21:
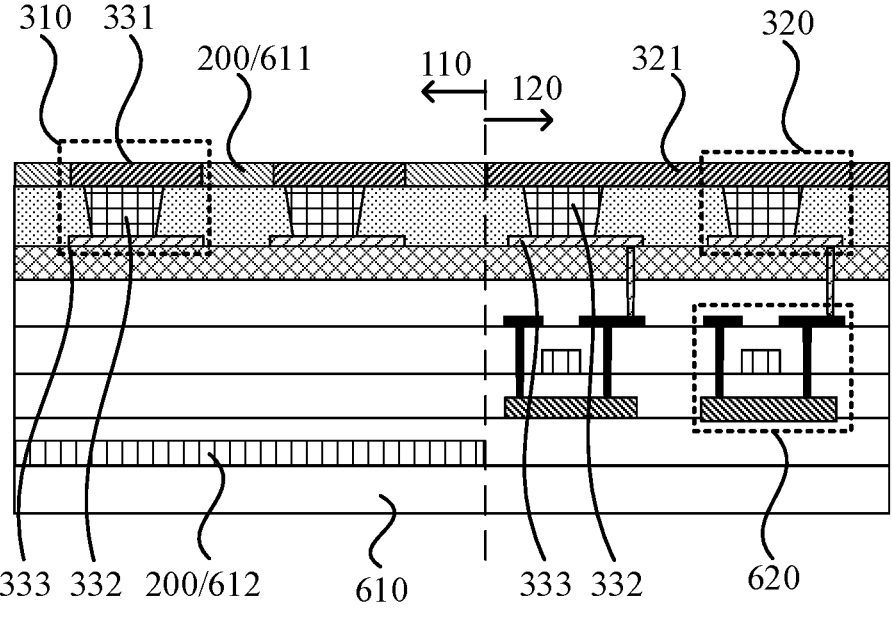
FIG. 21 is a sectional view taken along AA' of the display panel in FIG. 19.

FIG. 19 is another top view of a partial region of a display panel according to an embodiment of the present disclosure. FIG. 20 is a top view of a region S2 of the display panel in FIG. 19. FIG. 21 is a sectional view taken along AA' of the display panel in FIG. 19. Referring to FIGS. 19 to 21, the display panel further includes a substrate 610. The connection-line 200 is disposed on a side of the substrate 610. The first sub-pixels 310 includes cathode blocks 331. The connection-lines 200 includes cathode lines 611 electrically connected to the cathode blocks 331.

For example, referring to FIGS. 19 to 21, the cathode lines 611 are electrically connected to the cathode blocks 331 in the same layer, and the cathode lines 611 and the cathode blocks 331 may be formed by using the same material in the same technique, thereby saving manufacturing processes. Each of the cathode lines 611 and the cathode blocks 331 includes a magnesium-silver alloy and are translucent in a visible light band.

It is to be noted that referring to FIG. 20, the cathode lines 611 are electrically connected to the cathode blocks 331 in the same layer and the cathode lines 611 are connected to two cathode blocks 331. It is to be understood that cathode lines 611 and partial regions of the cathode blocks 331 in the same extension direction and electrically connected may be collectively considered as the connection-line 200.

In some embodiments, referring to FIGS. 19 to 21, the connection-lines 200 further includes a light-shielding layer 612 disposed between the cathode lines 611 and the substrate 610. The light-shielding layer 612 overlaps the cathode lines 611 in a direction perpendicular to the substrate 610. In the known art, the connection-line 200 includes the cathode lines 611 and the light-shielding layer 612, where the cathode lines 611 and the light-shielding layer 612 overlap in the direction perpendicular to the substrate 610. Misalignment occurs for both the cathode lines 611 and the light-shielding layer 612 at the inclined viewing angle. Since the cathode lines 611 and the light-shielding layer 612 are disposed in two different films, the superimposition of projections of the different films increases an overall light-shielding area. However, in the embodiment of the present disclosure, both the cathode lines 611 and the light-shielding layer 612 are arranged to extend from the region closer to the center O of the first display region 110 toward the region farther away from the center O of the first display region 110 so that the misalignment extent between the cathode lines 611 and the light-shielding layer 612 at the inclined viewing angle is reduced, reducing the overall light-shielding area and increasing the transmittance of the first display region 110.

For example, the light-shielding layer 612 is configured to be opaque in the visible light band.

In some embodiments, referring to FIGS. 19 to 21, with the light-shielding layer 612 as a mask, an entire cathode layer is irradiated by a laser so that the cathode lines 611 and the cathode blocks 331 are formed. After the entire cathode layer is formed, the entire cathode layer may be irradiated by the laser from the back side of the display panel and on one side of the substrate 610, the cathode layer that is not shielded by the light-shielding layer 612 is irradiated by the laser and thus removed, and the cathode layer that is shielded by the light-shielding layer 612 cannot be irradiated by the laser and thus is retained so that the cathode lines 611 and the cathode blocks 331 are formed.

In some embodiments, referring to FIG. 21, the second display region 120 includes a pixel driving circuit 620 disposed between the substrate 610 and a film where the cathode lines 611 are located. The light-shielding layer 612 is disposed between a film where the pixel driving circuit 620 is located and the substrate 610. Therefore, as an independent additional film, it is relatively convenient to set the thickness of the light-shielding layer 612. That is, an independent thickness can be set for the light-shielding layer 612. Generally, the thickness of the light-shielding layer 612 may be greater than the thickness of a single metal layer in the pixel driving circuit 620, to shield high-energy laser light. In other embodiments, the light-shielding layer 612 and the metal layer in the pixel driving circuit 620 may be in the same layer and formed by using the same material in the same technique, thereby saving the manufacturing processes.

For example, referring to FIG. 21, the pixel driving circuit 620 includes a thin-film transistor. The pixel driving circuit 620 may include multiple thin-film transistors and at least one storage capacitor. The specific circuit structure of the pixel driving circuit is not limited in the embodiment of the present disclosure.

Figure 22:
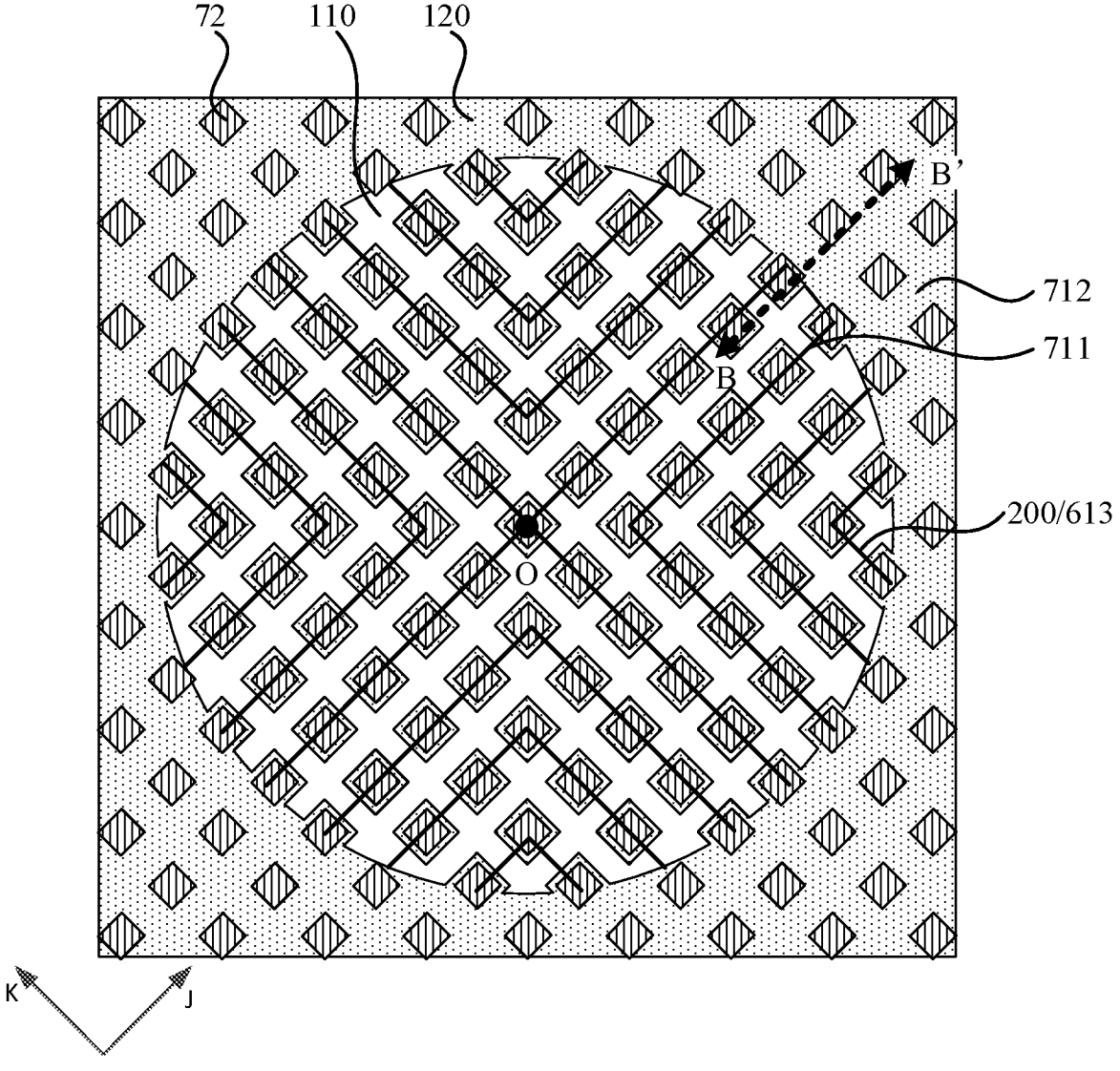
FIG. 22 is another top view of a partial region of a display panel according to an embodiment of the present disclosure.
Figure 23:
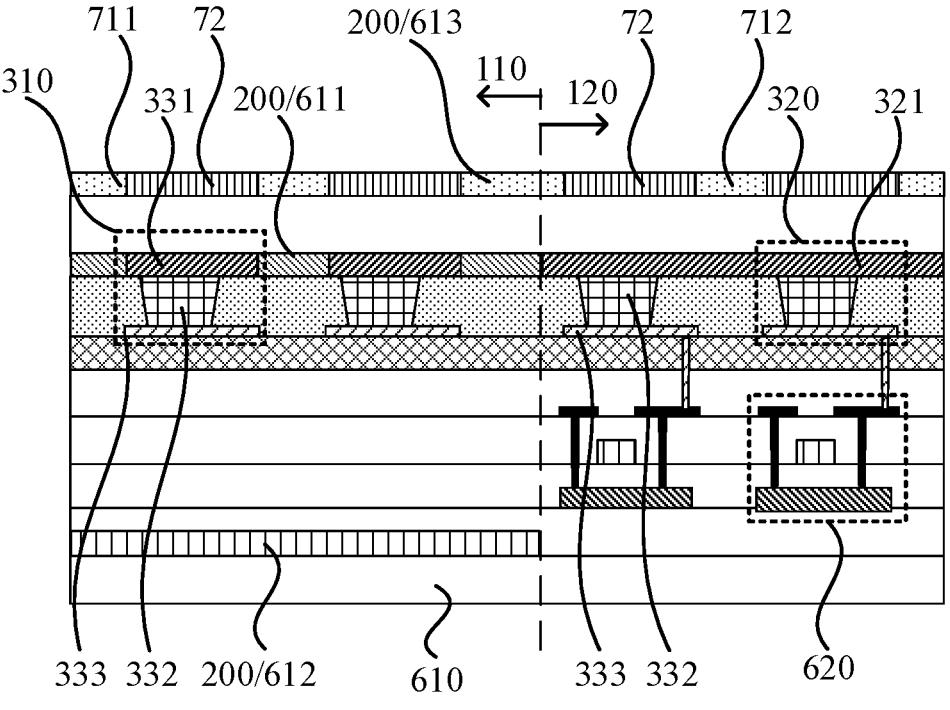
FIG. 23 is a sectional view taken along BB' of the display panel in FIG. 22.

FIG. 22 is another top view of a partial region of a display panel according to an embodiment of the present disclosure. FIG. 23 is a sectional view taken along BB of the display panel in FIG. 22. Referring to FIGS. 22 and 23, the connection-line 200 further includes an antireflection layer 613 disposed on a side of the cathode lines 611 facing away from the substrate 610. The antireflection layer 613 overlaps the cathode lines 611 in the direction perpendicular to the substrate 610. In the known art, the connection-line 200 includes the cathode lines 611 and the antireflection layer 613, where the cathode lines 611 and the antireflection layer 613 overlap in the direction perpendicular to the substrate 610. Misalignment occurs for both the cathode lines 611 and the antireflection layer 613 at the inclined viewing angle. Since the cathode lines 611 and the antireflection layer 613 are disposed in two different films, the superimposition of projections of the different films increases the overall light-shielding area. However, in the embodiment of the present disclosure, both the cathode lines 611 and the antireflection layer 613 are arranged to extend from the region closer to the center O of the first display region 110 toward the region farther away from the center O of the first display region 110 so that the misalignment extent between the cathode lines 611 and the antireflection layer 613 at the inclined viewing angle is reduced, reducing the overall light-shielding area and increasing the transmittance of the first display region 110.

For example, the antireflection layer 613 is translucent or opaque in the visible light band.

For example, referring to FIGS. 22 and 23, the connection-lines 200 includes the cathode lines 611, the light-shielding layer 612 and the antireflection layer 613, where any two of the cathode lines 611, the light-shielding layer 612 and the antireflection layer 613 overlap in the direction perpendicular to the substrate 610. In the embodiment of the present disclosure, the cathode lines 611, the light-shielding layer 612 and the antireflection layer 613 are arranged to extend from the region closer to the center O of the first display region 110 toward the region farther away from the center O of the first display region 110 so that the misalignment extent among the cathode lines 611, the light-shielding layer 612 and the antireflection layer 613 at the inclined viewing angle is reduced, reducing the overall light-shielding area and increasing the transmittance of the first display region 110.

In some embodiments, referring to FIGS. 22 and 23, the antireflection layer 613 includes a black matrix connection-line 711 including a light-absorbing material.

For example, referring to FIGS. 22 and 23, the display panel further includes a black matrix layer 712 and a color resist 72, where the black matrix layer 712 is disposed in the second display region 120. The black matrix layer 712 is provided with multiple openings. The color resist 72 is disposed on the side of the film where the cathode lines 611 are located facing away from the substrate 610. In the first display region 110, the color resist 72 overlaps the first sub-pixel 310 in the direction perpendicular to the substrate 610. In the second display region 120, the color resist 72 overlaps the second sub-pixel 320 in the direction perpendicular to the substrate 610, and the color resist 72 is disposed in an opening formed by the black matrix layer 712.

Figure 24:
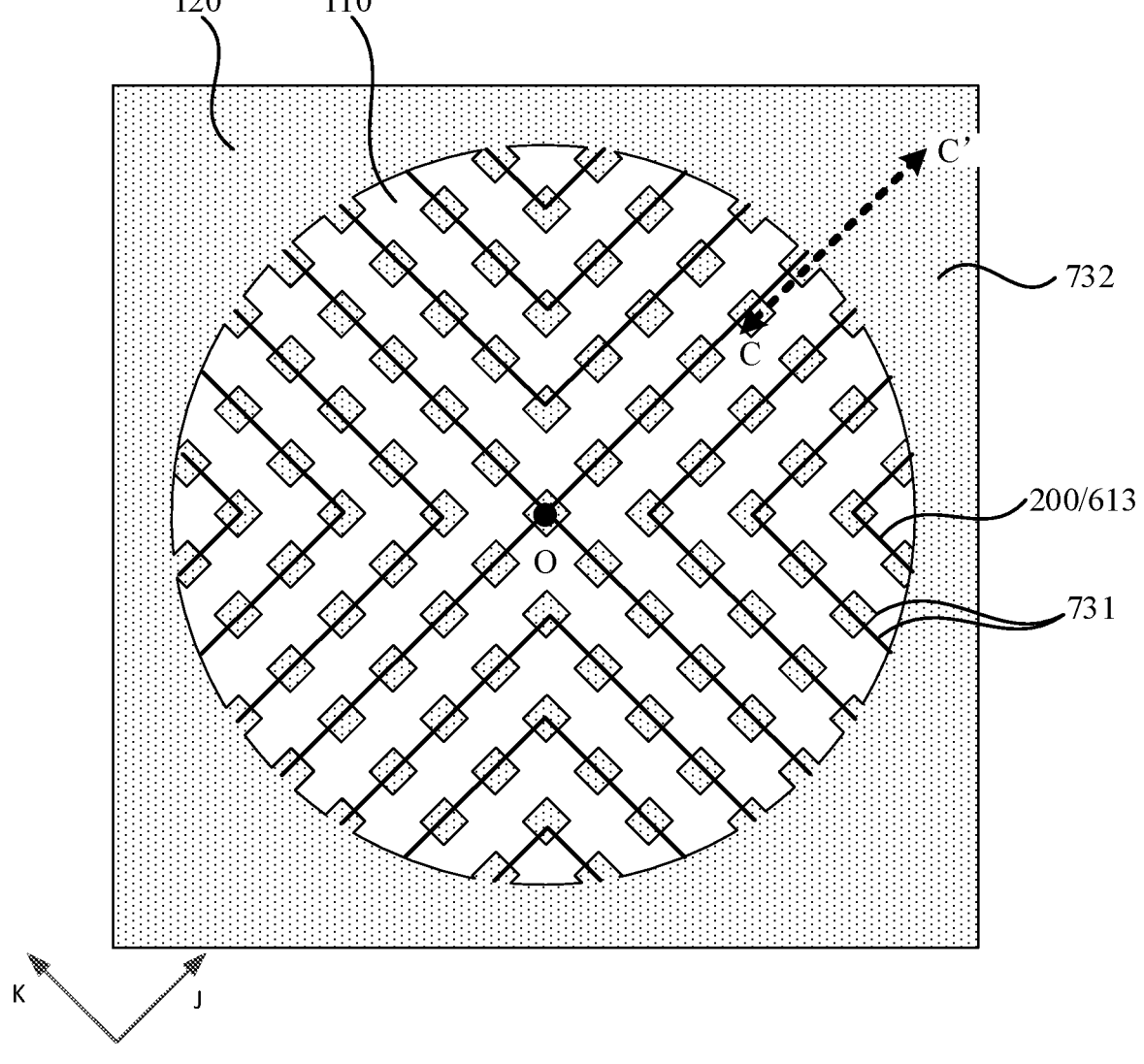
FIG. 24 is another top view of a partial region of a display panel according to an embodiment of the present disclosure.

FIG. 24 is another top view of a partial region of a display panel according to an embodiment of the present disclosure.

Figure 25:
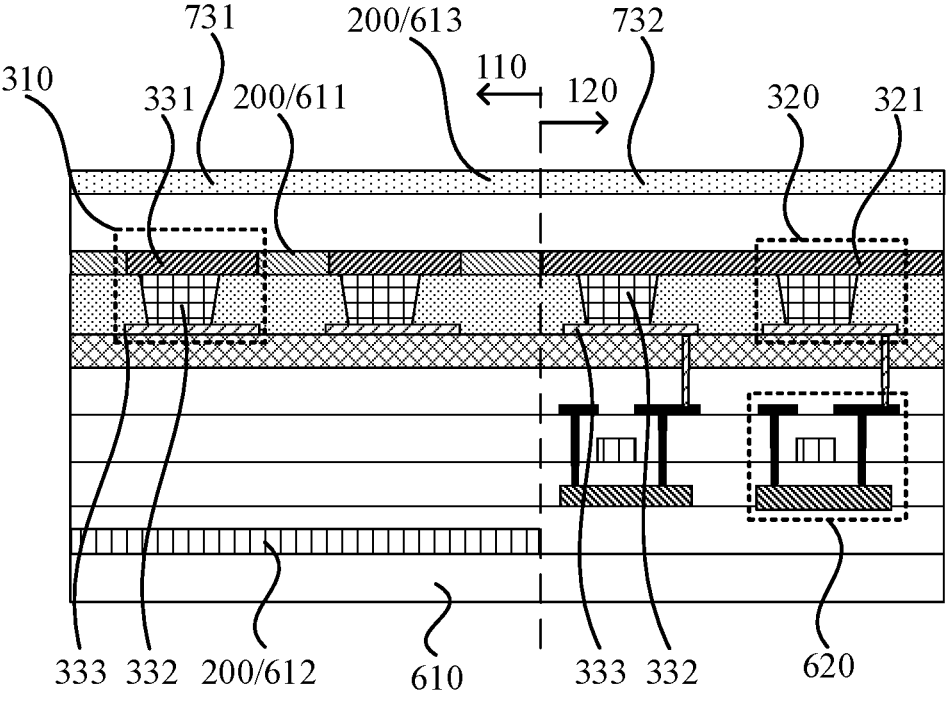
FIG. 25 is a sectional view taken along CC' of the display panel in FIG. 24.

FIG. 25 is a sectional view taken along CC' of the display panel in FIG. 24. Referring to FIGS. 24 and 25, the antireflection layer 613 includes a polarizer connection-line 731 including a polarizing material configured to change a polarization state of light passing through the polarizing material. The light passing through the polarizer connection-line 731 has reduced brightness since at least part of the light in the polarization state is blocked.

For example, referring to FIGS. 24 and 25, the display panel further includes a polarizer layer 732 disposed in the second display region 120. In the second display region 120, the polarizer layer 732 is disposed entirely and covers multiple second sub-pixels 320.

In some embodiments, referring to FIGS. 19 to 25, the second display region 120 includes the second sub-pixels 320. All the second sub-pixels 320 share the same cathode layer 321, and the cathode lines 611 are electrically connected to the cathode layer 321 so that the cathode lines 611 and the cathode layer 321 have the same common potential.

For example, referring to FIGS. 2 and 19 to 25, the first connection-line 210 is disposed in the first display region 110 and may be connected to a structure in the second display region 120. As shown in FIG. 19, when the first connection-line 210 includes the cathode lines 611, the cathode lines 611 are connected to the cathode layer 321 in the second display region 120. As shown in FIG. 22, when the first connection-line 210 includes the black matrix connection-line 711, the black matrix connection-line 711 is connected to the black matrix layer 712 in the second display region 120. As shown in FIG. 24, when the first connection-line 210 includes the polarizer connection-line 731, the polarizer connection-line 731 is connected to the polarizer layer 732 in the second display region 120.

For example, referring to FIGS. 2 and 19 to 25, the first connection-line 210 is disposed in the first display region 110 and may be connected to no structure in the second display region 120. As shown in FIG. 21, the first connection-line 210 includes the light-shielding layer 612 used as the mask when the first display region 110 is irradiated by the laser. Since the second display region 120 is not irradiated by the laser, no structure in the same layer as the light-shielding layer 612 is provided in the second display region 120. Therefore, the light-shielding layer 612 may be connected to no structure in the second display region 120.

Figure 26:
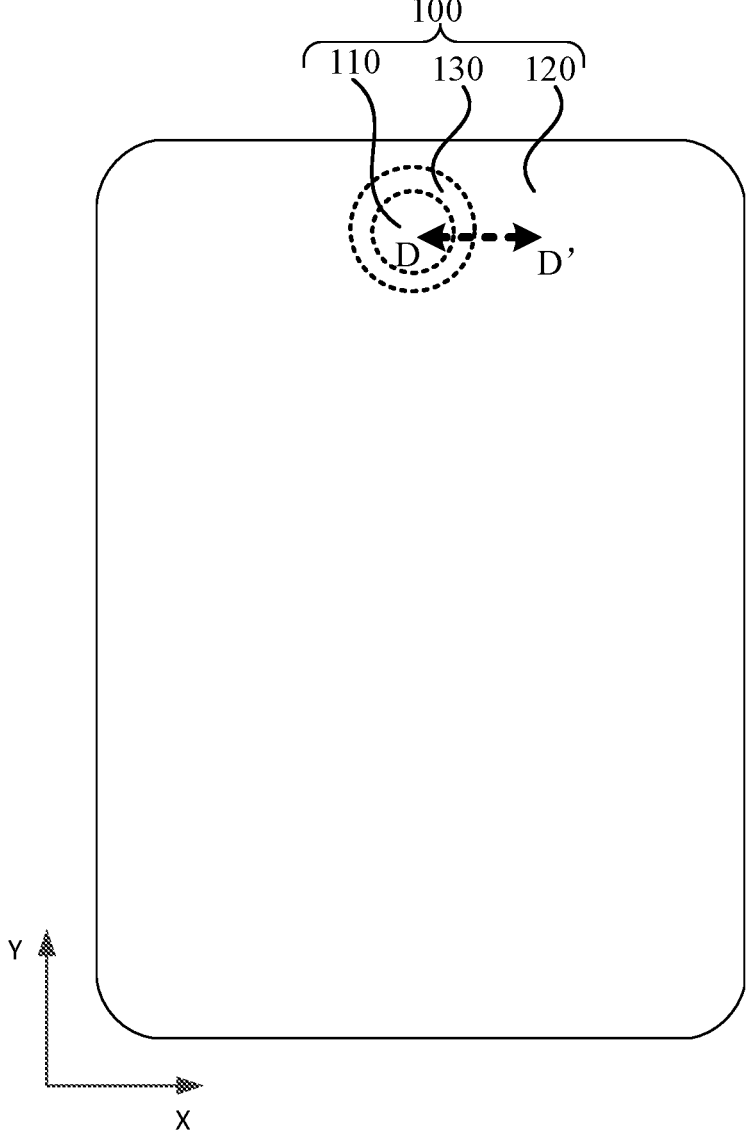
FIG. 26 is another top view of a display panel according to an embodiment of the present disclosure.
Figure 27:
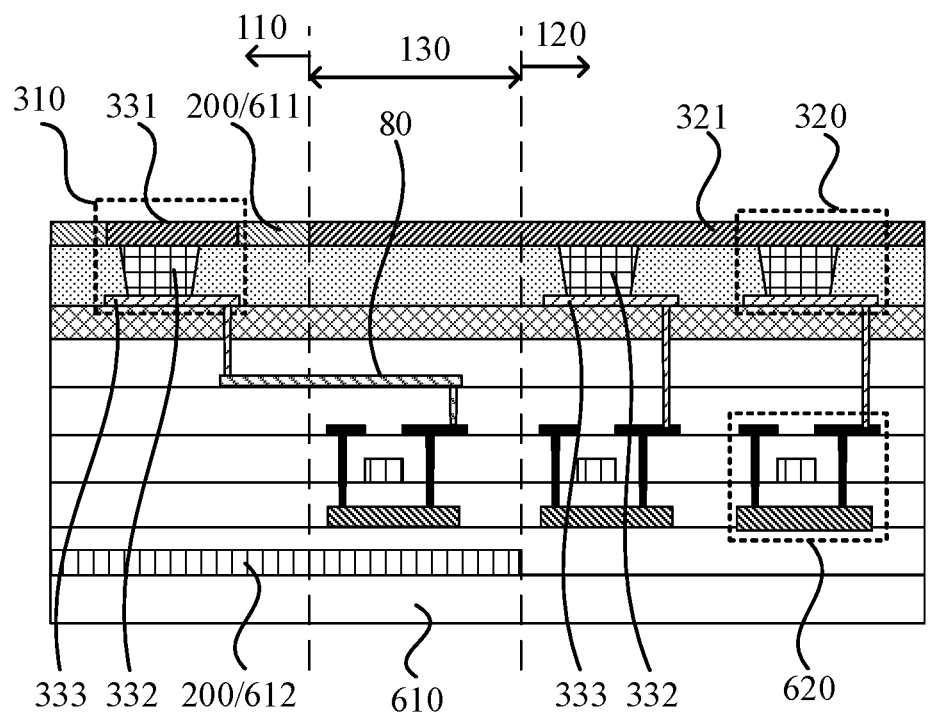
FIG. 27 is a sectional view taken along DD' of the display panel in FIG. 26.

FIG. 26 is another top view of a display panel according to an embodiment of the present disclosure. FIG. 27 is a sectional view taken along DD' of the display panel in FIG. 26. Referring to FIGS. 26 and 27, the display region 100 further includes a transition region 130 disposed between the first display region 110 and the second display region 120. As an example, the transition region 130 is disposed at the periphery of the first display region 110 and surrounds the first display region 110. The second display region 120 is disposed at the periphery of the transition region 130 and surrounds the transition region 130. The first sub-pixel 310 further includes an anode 333. The transition region 130 includes the pixel driving circuit 620 electrically connected to the anode 333, where the pixel driving circuit 620 provides a drive voltage and/or a drive current for the anode 333. In the embodiment of the present disclosure, the pixel driving circuit 620 for driving the first sub-pixel 310 in the first display region 110 is disposed in the transition region 130 so that the pixel driving circuit 620 does not occupy the space of the first display region 110, thereby increasing the transmittance of the first display region 110.

For example, referring to FIG. 27, the first sub-pixel 310 further includes a light-emitting function layer 332. In the first sub-pixel 310, the light-emitting function layer 332 is disposed between the anode 333 and the cathode blocks 331 in the direction perpendicular to the substrate 610. The second sub-pixel 320 further includes the light-emitting function layer 332 and the anode 333. In the second sub-pixel 320, the light-emitting function layer 332 is disposed between the anode 333 and the cathode layer 321 in the direction perpendicular to the substrate 610.

For example, referring to FIG. 27, the display panel further includes a transparent electrode connection-line 80 transparent in the visible light band. One end of the transparent electrode connection-line 80 is electrically connected to the anode 333 of the first sub-pixel 310 in the first display region 110 and the other end of the transparent electrode connection-line 80 is electrically connected to the pixel driving circuit 620 in the transition region 130. Since the transparent electrode connection-line 80 is transparent in the visible light band, the transparent electrode connection-line 80 in the first display region 110 does not reduce the transmittance of the first display region 110.

Figure 28:
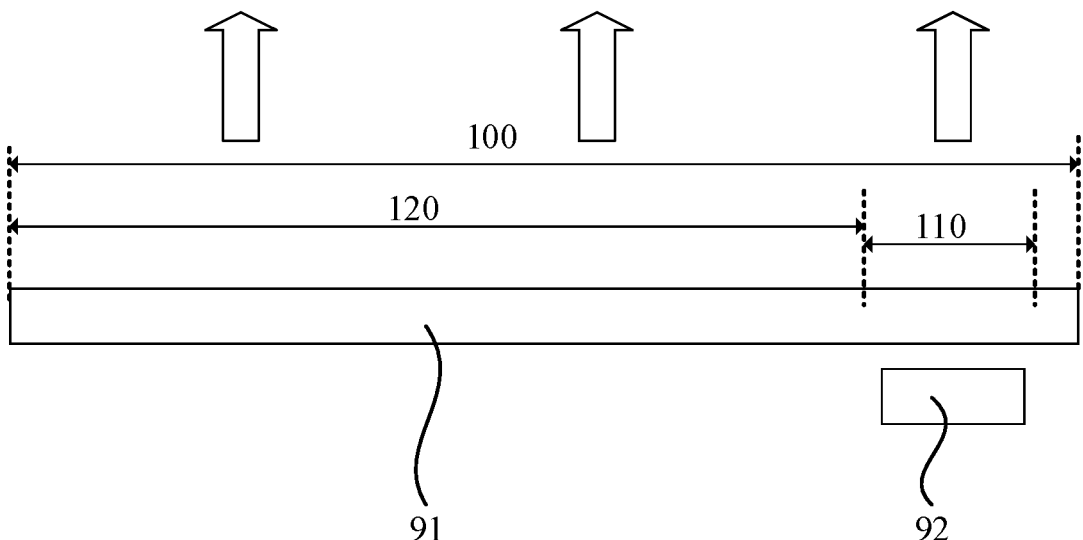
FIG. 28 is a sectional view of a display device according to an embodiment of the present disclosure.

FIG. 28 is a sectional view of a display device according to an embodiment of the present disclosure. Referring to FIG. 28, the display device includes a display panel 91 and a photosensor 92. The photosensor 92 is disposed in a first display region 110 and on a non-light-emitting display side of the display panel 91. Ambient light transmits the first display region 110 of the display panel 91 and reaches the photosensor 92 on the back side of the display panel 91, thereby implementing particular optical performance, for example, functions such as image capture.

In FIG. 28, the direction of arrows represents a light-emitting display direction of the display panel 91. The display device may specifically be a mobile phone, a tablet computer, a smart wearable apparatus and the like.

What is claimed is:

1. A display panel, comprising a display region, wherein the display region comprises a first display region and a second display region, and a transmittance of the first display region is higher than a transmittance of the second display region; and the first display region comprises connection-lines comprising first connection-lines, wherein the first connection-lines extend in different directions from a region closer to a center of the first display region toward a region farther away from the center of the first display region; and wherein the first connection-lines are disposed in a manner of radiating from the center of the first display region, or at least two of the plurality of the first connection-lines extend in different and non-parallel directions;

wherein the first display region comprises a central region and a peripheral region, the peripheral region surrounds the central region; and the first connection-lines are disposed in the peripheral region;

wherein the connection-lines further comprise second connection-lines disposed in the central region, the second connection-lines extends along a first direction or a second direction, and the first direction intersects the second direction;

wherein the first connection-lines comprise first sub-connection-lines extending in a third direction and second sub-connection-lines extending in a fourth direction intersects the third direction, and both the third direction and the fourth direction intersect the first direction or the second direction; and wherein at least one of the second connection-lines each is connected to one or more of the first sub-connection-lines and one or more of the second sub-connection-lines.

2. The display panel according to claim 1, wherein a first connection-line of the first connection-lines comprises a straight line segment, wherein a radial component of the straight line segment is greater than a tangential component of the straight line segment.

3. The display panel according to claim 1, wherein a first connection-line of the first connection-lines comprises a straight line segment, wherein a line between a center of the straight line segment and the center of the first display region is denoted as an auxiliary line and an included angle between the auxiliary line and the first connection-line is smaller than or equal to 45°; and wherein the center of the straight line segment is a center of the straight line segment along a length extension direction of the straight line segment.

4. The display panel according to claim 1, wherein the second display region comprises a plurality of pixel units, and the plurality of pixel units are arranged in an array along the first direction and the second direction.

5. The display panel according to claim 1, wherein a first connection-line of the first connection-lines or an extension line of a first connection-line of the first connection-lines passes through the center of the first display region.

6. The display panel according to claim 1, wherein the first display region comprises first sub-pixels; and a first sub-connection-line of the first sub-connection-lines passes through at least one of the first sub-pixels, a second sub-connection-line of the second sub-connection-lines passes through at least one of the first sub-pixels.

7. The display panel according to claim 6, wherein the first sub-connection-line and the second sub-connection-line are connected to form a first connection structure; and in the first display region, a plurality of first connection structures are arranged from the region closer to the center of the first display region toward the region farther away from the center of the first display region.

8. The display panel according to claim 7, wherein the first connection-line further comprises a third sub-connection-line and a fourth sub-connection-line, wherein the third sub-connection-line extends along a fifth direction and passes through at least one of the first sub-pixels, and the fourth sub-connection-line extends along a sixth direction and passes through at least one of the first sub-pixels, and wherein the third direction, the fourth direction, the fifth direction and the sixth direction are intersected with each other; and wherein the second sub-connection-line and the third sub-connection-line are connected to form a second connection structure, the third sub-connection-line and the fourth sub-connection-line are connected to form a third connection structure, and the fourth sub-connection-line and the first sub-connection-line are connected to form a fourth connection structure; and a plurality of second connection structures are arranged from the region closer to the center of the first display region toward the region farther away from the center of the first display region, a plurality of third connection structures are arranged from the region closer to the center of the first display region toward the region farther away from the center of the first display region, and a plurality of fourth connection structures are arranged from the region closer to the center of the first display region toward the region farther away from the center of the first display region.

9. The display panel according to claim 1, wherein the first display region comprises a plurality of first sub-pixel strings: wherein each of the plurality of first sub-pixel strings comprises a plurality of first sub-pixels; and the plurality of first sub-pixels in each of the plurality of first sub-pixel strings are disposed on a path of a same first connection-line; and an extension line of each of the plurality of first sub-pixel strings passes through the center of the first display region.

10. The display panel according to claim 9, wherein in each of the plurality of first sub-pixel strings, the plurality of first sub-pixels comprises a first-color sub-pixel, a second-color sub-pixel and a third-color sub-pixel, and the first-color sub-pixel, the second-color sub-pixel and the third-color sub-pixel have emitted colors different from each other; and wherein the first-color sub-pixel, the second-color sub-pixel and the third-color sub-pixel are sequentially arranged in a same first sub-pixel string, or, wherein the plurality of first sub-pixels comprises a first-color sub-pixel, a second-color sub-pixel and a third-color sub-pixel, wherein the first-color sub-pixel, the second-color sub-pixel and the third-color sub-pixel have emitted colors different from each other; and a plurality of first sub-pixels with a same distance from the center of the first display region are disposed on a same pixel ring, and the first-color sub-pixel, the second-color sub-pixel and the third-color sub-pixel are sequentially arranged in the same pixel ring, or, wherein a plurality of first sub-pixels with a same distance from the center of the first display region are disposed on a same pixel ring; and a number of first sub-pixel strings overlapping the pixel ring gradually increases in a direction from the region closer to the center of the first display region toward the region farther away from the center of the first display region.

11. The display panel according to claim 7, wherein the first connection-line comprises a first-type connection-line and a second-type connection-line;

a distance between the center of the first display region and an end of the first-type connection-line facing the center of the first display region is smaller than a distance between the center of the first display region and an end of the second-type connection-line facing the center of the first display region; and a number of first sub-pixels through which the first-type connection-line passes is greater than a number of first sub-pixels through which the second-type connection-line passes.

12. The display panel according to claim 1, wherein the first display region comprises a first sub-pixel row and a second sub-pixel row, wherein the first sub-pixel row and the second sub-pixel row each extend along a first direction and comprise a plurality of first sub-pixels; and along a second direction, two adjacent first sub-pixel rows are spaced by one second sub-pixel row and two adjacent second sub-pixel rows are spaced by one first sub-pixel row; wherein the first direction intersects the second direction:

in each of the first sub-pixel row and the second sub-pixel row, the plurality of first sub-pixels comprises a first-color sub-pixel, a second-color sub-pixel and a third-color sub-pixel, and the first-color sub-pixel, the second-color sub-pixel and the third-color sub-pixel have emitted colors different from each other;

in the first sub-pixel row, two adjacent first-color sub-pixels are spaced by one third-color sub-pixel, two adjacent third-color sub-pixels are spaced by one first-color sub-pixel, and a first gap exists between the first-color sub-pixel and the third-color sub-pixel adjacent to each other;

the second sub-pixel row comprises a plurality of second-color sub-pixels; and the second-color sub-pixel overlaps the first gap along the second direction.

13. The display panel according to claim 1, wherein the first display region comprises a plurality of pixel unit rows, wherein each of the plurality of pixel unit rows extends along a first direction and comprises a plurality of pixel units; and in each of the plurality of pixel unit rows, a second gap exists between two adjacent pixel units:

along a second direction, each of the plurality of pixel units overlaps the second gap in a pixel unit row adjacent to the each of the plurality of pixel units: wherein the first direction intersects the second direction;

in each of the plurality of pixel unit rows, the plurality of pixel units comprises a first sub-pixel comprising a first-color sub-pixel, a second-color sub-pixel and a third-color sub-pixel, and the first-color sub-pixel, the second-color sub-pixel and the third-color sub-pixel have emitted colors different from each other; and in a same pixel unit, the first-color sub-pixel, the third-color sub-pixel and the second-color sub-pixel are arranged along the first direction, and two second-color sub-pixels are arranged along the second direction.

14. The display panel according to claim 9, further comprising a substrate, wherein the connection-lines are disposed on a side of the substrate:

the first sub-pixels comprise cathode blocks; and the connection-lines comprise cathode lines electrically connected to the cathode blocks.

15. The display panel according to claim 14, wherein the connection-lines further comprise a light-shielding layer disposed between the cathode lines and the substrate; and the light-shielding layer overlaps the cathode lines in a direction perpendicular to the substrate, wherein the cathode lines and the cathode blocks are formed by irradiating an entire cathode layer with the light-shielding layer as a mask, and the entire cathode layer is irradiated by a laser, and wherein the second display region comprises a pixel driving circuit disposed between the substrate and a film where the cathode lines are located; and the light-shielding layer is disposed between a film where the pixel driving circuit is located and the substrate.

16. The display panel according to claim 14, wherein the connection-line further comprise an antireflection layer disposed on a side of the cathode lines facing away from the substrate; and wherein the antireflection layer overlaps the cathode lines in a direction perpendicular to the substrate, wherein the antireflection layer comprises a black matrix connection-line comprising a light-absorbing material, and wherein the antireflection layer comprises a polarizer connection-line comprising a polarizing material, and the polarizing material is used to change a polarization state of light passing through the polarizing material.

17. The display panel according to claim 14, wherein the second display region comprises second sub-pixels; and wherein all the second sub-pixels share a same cathode layer, and the cathode lines are electrically connected to the cathode layer.

18. The display panel according to claim 14, wherein the display region further comprises a transition region disposed between the first display region and the second display region:

the first sub-pixel further comprises an anode; and the transition region comprises a pixel driving circuit electrically connected to the anode.

19. The display panel according to claim 1, wherein the connection-lines are translucent or opaque in a visible light band.

20. A display device, comprising a display panel and a photosensor;

wherein the photosensor is disposed in a first display region and on a non-light-emitting display side of the display panel, wherein the display panel comprises a display region, the display region comprises a first display region and a second display region, and a transmittance of the first display region is higher than a transmittance of the second display region;

wherein the first display region comprises connection-lines comprising first connection-lines, wherein the first connection-lines extend in different directions from a region closer to a center of the first display region toward a region farther away from the center of the first display region; and wherein the first connection-lines are disposed in a manner of radiating from the center within the first display region, or at least two of the plurality of the first connection-lines extend in different and non-parallel directions;

wherein the first display region comprises a central region and a peripheral region, the peripheral region surrounds the central region; and the first connection-lines are disposed in the peripheral region;

wherein the connection-lines further comprise second connection-lines disposed in the central region, the second connection-lines extends along a first direction or a second direction, and the first direction intersects the second direction;

wherein the first connection-lines comprise first sub-connection-lines extending in a third direction and second sub-connection-lines extending in a fourth direction intersects the third direction, and both the third direction and the fourth direction intersect the first direction or the second direction; and wherein at least one of the second connection-lines each is connected to one or more of the first sub-connection-lines and one or more of the second sub-connection-lines.

\* \* \* \* \*